United States Patent
Lim et al.

(10) Patent No.: US 11,651,831 B2
(45) Date of Patent: May 16, 2023

(54) REDUNDANCY ANALYSIS CIRCUIT AND MEMORY SYSTEM INCLUDING THE SAME

(71) Applicant: SK hynix Inc., Gyeonggi-do (KR)

(72) Inventors: Jae Il Lim, Gyeonggi-do (KR); Du Hyun Kim, Gyeonggi-do (KR); Bo Ra Kim, Gyeonggi-do (KR); Sung Eun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 283 days.

(21) Appl. No.: 17/039,207

(22) Filed: Sep. 30, 2020

(65) Prior Publication Data
US 2021/0375379 A1    Dec. 2, 2021

(30) Foreign Application Priority Data

May 29, 2020  (KR) ........................ 10-2020-0064899

(51) Int. Cl.
| | |
|---|---|
| *G11C 29/38* | (2006.01) |
| *G11C 29/44* | (2006.01) |
| *H01L 25/18* | (2023.01) |
| *H01L 25/065* | (2023.01) |
| *G11C 29/54* | (2006.01) |

(52) U.S. Cl.
CPC .......... *G11C 29/38* (2013.01); *G11C 29/4401* (2013.01); *H01L 25/0652* (2013.01); *H01L 25/18* (2013.01); *H01L 2225/06513* (2013.01); *H01L 2225/06541* (2013.01)

(58) Field of Classification Search
None
See application file for complete search history.

(56) References Cited

U.S. PATENT DOCUMENTS

| | | | | |
|---|---|---|---|---|
| 5,568,437 A | * | 10/1996 | Jamal ..................... | G11C 29/44 365/201 |
| 5,946,246 A | * | 8/1999 | Jun ......................... | G11C 29/26 365/201 |

(Continued)

FOREIGN PATENT DOCUMENTS

| | | | |
|---|---|---|---|
| KR | 10-2019-0121585 | 10/2019 | |
| WO | WO-2012046343 A1 * | 4/2012 | .......... G06F 11/0751 |

OTHER PUBLICATIONS

Cho et al., An Efficient BIRA Utilizing Characteristics of Spare Pivot Faults, IEEE Transactions on Computer-Aided Design of Integrated Circuits and Systems, Mar. 2019, p. 551-p. 561, vol. 38, IEEE.

*Primary Examiner* — April Y Blair
*Assistant Examiner* — Dipakkumar B Gandhi
(74) *Attorney, Agent, or Firm* — IP & T Group LLP

(57) ABSTRACT

A memory system includes a memory device including a plurality of banks, each including row and column spares for replacing defective rows and columns; and a memory controller suitable for controlling an operation of the memory device, wherein the memory controller includes: a built-in self-test (BIST) circuit suitable for performing a test operation on the banks and generating fail addresses for each bank based on a result of the test operation; and a built-in redundancy analysis (BIRA) circuit suitable for determining first and second spare counts by respectively counting the number of repairable row spares and repairable column spares, and selecting a target repair address from the fail addresses for each bank, according to the first and second spare counts.

22 Claims, 22 Drawing Sheets

(56) References Cited

U.S. PATENT DOCUMENTS

| | | | | |
|---|---|---|---|---|
| 6,085,334 | A * | 7/2000 | Giles | G11C 29/40 |
| | | | | 714/6.32 |
| 7,149,921 | B1 * | 12/2006 | Zorian | G11C 29/72 |
| | | | | 714/30 |
| 7,859,900 | B2 | 12/2010 | Hsiao et al. | |
| 9,870,837 | B1 * | 1/2018 | Shim | G11C 29/787 |
| 10,403,390 | B1 * | 9/2019 | Wilson | G11C 17/18 |
| 2002/0091965 | A1 * | 7/2002 | Moshayedi | G06F 11/004 |
| | | | | 714/6.13 |
| 2007/0156379 | A1 * | 7/2007 | Kulkarni | H01L 21/67005 |
| | | | | 703/14 |
| 2010/0135099 | A1 * | 6/2010 | Park | G11C 5/144 |
| | | | | 702/60 |

* cited by examiner

FIG. 4

|  | 210 | |
|---|---|---|
| BK_ADD | RADD | CADD |

SPARE LINE →
| 001 | 01001 | 00111 |
| 001 | 01001 | 00001 |
| 001 | 01100 | 11000 |

. . .

| 010 | 01001 | 10111 |
| 010 | 01001 | 10001 |

FIG. 5

|  | 230 | |
|---|---|---|
|  | R_CNT | C_CNT |
| COUNT LINE for BK0 | 101 | 110 |
|  | 100 | 110 |
|  | 100 | 110 |
|  | 001 | 101 |
|  | 001 | 110 |
|  | 100 | 000 |
|  | 111 | 010 |
|  | 100 | 001 |

FIG. 6B

| FAULT DETECTION ORDER | (RADD, CADD) | CLASSIFIED |
|---|---|---|
| #1 | (2,1) | spare pivot fault |
| #2 | (5,3) | spare pivot fault |
| #3 | (5,1) | non-spare pivot fault |
| #4 | (2,3) | non-spare pivot fault |
| #5 | (1,4) | spare pivot fault |
| #6 | (7,7) | spare pivot fault |
| #7 | (7,4) | non-spare pivot fault |
| #8 | (5,7) | non-spare pivot fault |

FIG. 12A

R_CNT0 → 010
C_CNT0 → 011

NCA   CADD
  0 1 2 3 4 5 6 7
0
1
2
3
4  RADD
5
6
7

T1

| SP_V | RADD | CADD |
|------|------|------|
|      |      |      |
|      |      |      |
|      |      |      |
|      |      |      |
|      |      |      |

T2

|    | R1 | R2 | R3 | R4 | R5 |
|----|----|----|----|----|----|
| C1 |    |    |    |    |    |
| C2 |    |    |    |    |    |
| C3 |    |    |    |    |    |
| C4 |    |    |    |    |    |
| C5 |    |    |    |    |    |

FIG. 12B

NCA, CADD grid with #1 marked at row 2, column 1.

T1

| SP_V | RADD | CADD |
|---|---|---|
| 1 | 2 | 1 |
| | | |
| | | |
| | | |
| | | |

T2

| | 2 | R2 | R3 | R4 | R5 |
|---|---|---|---|---|---|
| 1 | | | | | |
| C2 | | | | | |
| C3 | | | | | |
| C4 | | | | | |
| C5 | | | | | |

| SP_V | RADD | CADD |
|------|------|------|
| 1 | 2 | 1 |
| 1 | 5 | 3 |
|  |  |  |
|  |  |  |
|  |  |  |

T2

|  | 2 | 5 | R3 | R4 | R5 |
|---|---|---|---|---|---|
| 1 |  | 1 |  |  |  |
| 3 |  |  |  |  |  |
| C3 |  |  |  |  |  |
| C4 |  |  |  |  |  |
| C5 |  |  |  |  |  |

| SP_V | RADD | CADD |
|---|---|---|
| 1 | 2 | 1 |
| 1 | 5 | 3 |
| | | |
| | | |
| | | |

T2

| | 2 | 5 | R3 | R4 | R5 |
|---|---|---|---|---|---|
| 1 | | 1 | | | |
| 3 | 1 | | | | |
| C3 | | | | | |
| C4 | | | | | |
| C5 | | | | | |

T1

| SP_V | RADD | CADD |
|---|---|---|
| 1 | 2 | 1 |
| 1 | 5 | 3 |
| 1 | 1 | 4 |
| 1 | 7 | 7 |
| | | |

T2

| | 2 | 5 | 1 | 7 | R5 |
|---|---|---|---|---|---|
| 1 | | 1 | | | |
| 3 | 1 | | | | |
| 4 | | | | 1 | |
| 7 | | 1 | | | |
| C5 | | | | | |

FIG. 12G

REDUNDANCY ANALYSIS CIRCUIT AND MEMORY SYSTEM INCLUDING THE SAME

CROSS-REFERENCE TO RELATED APPLICATION

This application claims priority under 35 U.S.C. § 119 to Korean Patent Application No. 10-2020-0064899, filed on May 29, 2020, the disclosure of which is incorporated herein by reference in its entirety.

BACKGROUND

1. Field

Various embodiments of the present invention relate to a memory system for performing a test operation using a built-in self-test (BIST) circuit, and performing a repair operation using a built-in redundancy analysis (BIRA) circuit based on a test result.

2. Description of the Related Art

As semiconductor technology advances, development of large-capacity, high-performance memory devices are rapidly progressing. Recently, during mass production of memory devices, a defective/fail cell is repaired by replacing it with a spare (redundant) cell to satisfy yield and quality. For embedded memory devices used in most system-on-chips (SoCs), testing and repairing using expensive external test devices are costly. As a result, by placing a built-in self-test (BIST) circuit and a built-in redundancy analysis (BIRA) circuit in SoC (e.g., memory controller), repair information (i.e., an address of a fail cell) is obtained using the BIST circuit and repair information is analyzed using the BIRA circuit.

Generally, for a repair operation after packaging (i.e., a post-package repair (PPR) operation), a certain number of redundant word lines or bit lines may be pre-allocated for each bank of the memory device. The redundant word lines or bit lines assigned to each bank for the PPR operation may be fixed, but there may be a redundant word line or bit line that remains unused in a repair operation before packaging (i.e., a pre-package repair operation). For example, even if three redundant word lines or bit lines are assigned to each bank for the PPR operation, there may be more than three redundant word lines or bit lines. Thus, the fixed assignment of the redundant word lines or bit lines for the PPR operation results in poor repair efficiency.

SUMMARY

Various embodiments of the present invention are directed to a redundancy analysis circuit capable of performing a post-package repair (PPR) operation by reflecting the status of redundant word lines or bit lines that are unused during a pre-package repair operation, and a memory system including the same.

In accordance with an embodiment of the present invention, a memory system may include: a memory device including a plurality of banks, each including row and column spares for replacing defective rows and columns; and a memory controller suitable for controlling an operation of the memory device, wherein the memory controller includes: a built-in self-test (BIST) circuit suitable for performing a test operation on the banks and generating fail addresses for each bank based on a result of the test operation; and a built-in redundancy analysis (BIRA) circuit suitable for determining first and second spare counts by respectively counting the number of repairable row spares and repairable column spares, and selecting a target repair address from the fail addresses for each bank, according to the first and second spare counts.

In accordance with an embodiment of the present invention, a redundancy analysis circuit may include: a fail address storing circuit suitable for storing fail addresses each including a bank address, a row address, and a column address; a redundancy information acquiring circuit suitable for generating first and second spare counts by respectively counting the number of repairable row spares and repairable column spares; a counting information storing circuit suitable for storing the first and second spare counts for each bank; and a target selecting circuit suitable for selecting a target repair address from the fail addresses for each bank, according to the first and second spare counts.

In accordance with an embodiment of the present invention, a method of operating a memory system including a memory device including a plurality of banks, and a memory controller including a built-in self-test (BIST) circuit and a built-in redundancy analysis (BIRA) circuit, may include: determining, by the BIRA circuit, first and second spare counts by respectively counting the number of repairable row spares and repairable column spares for each bank; performing, by the BIST circuit, a test operation on the banks and generating fail addresses for each bank based on a result of the test operation; and selecting, by the BIRA circuit, a target repair address from the fail addresses for each bank, according to the first and second spare counts.

In accordance with an embodiment of the present invention, a memory system may include: a memory device including a plurality of banks, each including normal cells and row and column spares for replacing defective rows and columns among the normal cells, the row and column spares including spares assigned in a pre-packaging operation and spares assigned in a post-package repair operation; and a memory controller suitable for controlling an operation of the memory device, wherein the memory controller includes: a built-in self-test (BIST) circuit suitable for performing a test operation on each bank and generating fail addresses for each bank; and a built-in redundancy analysis (BIRA) circuit suitable for determining the number of repairable row spares and repairable column spares among the row and column spares, determining whether each of the fail addresses correspond to a spare pivot having a row address and a column address, which do not overlap any of a row address and a column address of previously detected fail cell, and selecting a target repair address from the fail addresses for each bank, according to the number of repairable row spares and repairable column spares and the determining whether each of the fail addresses correspond to the spare pivot.

BRIEF DESCRIPTION OF THE DRAWINGS

FIG. 4 is a diagram illustrating a fail address storing circuit, such as that of FIG. 1.

FIG. 5 is a diagram illustrating a counting information storing circuit, such as that of FIG. 1.

FIGS. 6A and 66 are diagrams illustrating a spare pivot and a non-spare pivot in accordance with an embodiment of the present invention.

DETAILED DESCRIPTION

Various embodiments of the present invention are described below in more detail with reference to the accompanying drawings. These embodiments are provided so that this disclosure is thorough and complete. Reference to "an embodiment," another embodiment" or the like is not necessarily to only one embodiment, and different references to any such phrase are not necessarily to the same embodiment(s). The term "embodiments" when used herein does not necessarily refer to all embodiments. The embodiments presented are merely examples and are not intended to limit the scope of the invention.

Moreover, it is noted that the terminology used herein is to describe embodiments only, not to limit the invention. As used herein, a singular form is intended to include the plural form as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed as a second or third element in another instance without indicating any change in the element itself.

In the following description, numerous specific details are set forth in order to provide a thorough understanding of the present invention. However, it is noted, that the present invention may be practiced without some or all these specific details.

In other instances, well-known process structures and/or processes are not described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated. The drawings are not necessarily to scale and, in some instances, proportions may have been exaggerated to clearly illustrate features of the embodiments.

Figure 1:
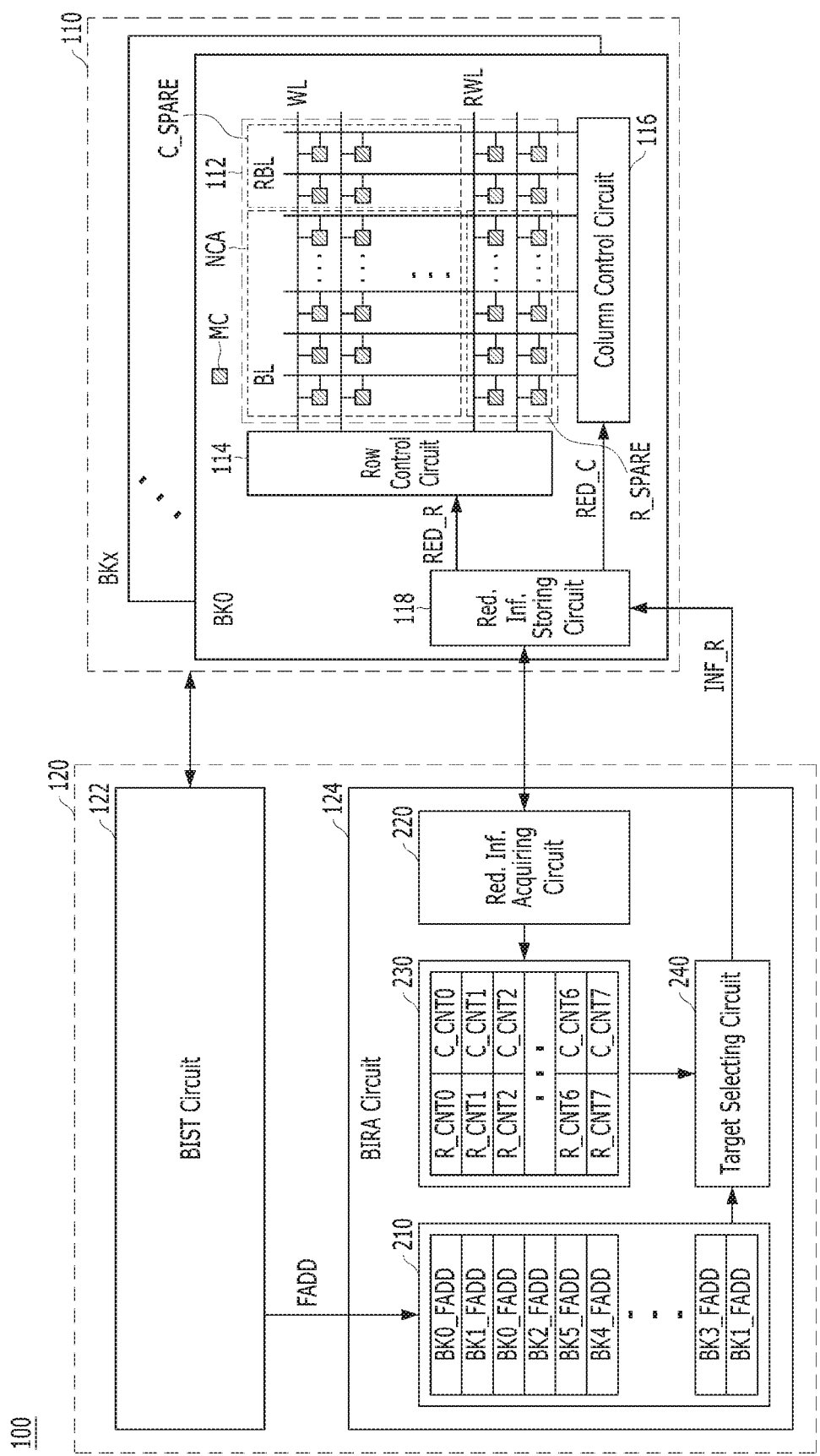
FIG. 1 is a block diagram illustrating a memory system in accordance with an embodiment of the present invention.

FIG. 1 is a block diagram illustrating a memory system 100 in accordance with an embodiment of the present invention.

Referring to FIG. 1, the memory system 100 may include a semiconductor memory device 110 and a memory controller 120. In an embodiment, the memory system 100 may be implemented with a module structure such as a dual in-line memory module (DIMM) or a high bandwidth memory (HBM) device in which the memory device 110 and the memory controller 120 are integrated into one substrate.

The memory device 110 may include a plurality of banks BK0 to BKx. Since each of the banks BK0 to BKx may have substantially the same structure, a first bank BK0 is described below as an example. However, the present invention is not limited to this particular structure; rather, the memory device 110 may be configured with any of several different types of structures depending on memory type or memory function.

The first bank BK0 may include a memory cell array 112, a row control circuit 114, a column control circuit 116, and a redundancy information storing circuit 118. In an embodiment, the memory device 110 may include a volatile memory device such as a dynamic random access memory device (DRAM). In another embodiment, the memory device 110 may include a non-volatile memory device such as a flash memory, a phase-change random access memory (PCRAM), a resistive random access memory (ReRAM), a ferroelectric random access memory (FeRAM), a magnetic random access memory (MRAM), and/or a spin transfer magnetic random access memory (STT-MRAM).

The memory cell array 112 may include a plurality of memory cells MC, some classified as normal cells and others classified as spare (or redundant) cells. The normal cells may be coupled at intersections of normal word lines WL and normal bit lines BL, whereas the spare cells may be coupled to any redundant word line RWL or redundant bit line RBL. That is, the memory cell array 112 may include a normal cell array NCA in which the normal cells are disposed, row spares R_SPARE corresponding to the redundant word lines RWL, and column spares C_SPARE corresponding to the redundant bit lines RBL.

The row control circuit 114 may be coupled to the memory cell array 112 through the word lines WL and RWL. The row control circuit 114 may select the word lines WL and RWL by decoding a row address according to a control signal (not shown) provided from the memory controller 120. For example, the row control circuit 114 may select a word line corresponding to the row address from the word lines WL and RWL, according to an active command. The row control circuit 114 may perform a repair operation of replacing a defective word line WL coupled to a fail cell disposed in the normal cell array NCA, with one of the row spares R_SPARE (i.e., a redundant word line RWL), based on row repair information RED_R.

The column control circuit 116 may be coupled to the memory cell array 112 through the bit lines BL and RBL. The column control circuit 116 may select the bit lines BL and RBL by decoding a column address according to a control signal (not shown) provided from the memory controller 120. For example, the column control circuit 116 may select a bit line corresponding to the column address from the bit lines BL and RBL, according to a write command or a read command. The column control circuit 116 may perform a repair operation of replacing a defective bit line BL coupled to a fail cell disposed in the normal cell array NCA, with one of the column spares C_SPARE (i.e., a redundant bit line RBL), based on column repair information RED_C.

Although FIG. 1 shows the row control circuit 114 and the column control circuit 116 for controlling an operation of the memory cell array 112, the present invention is not limited to this configuration. Alternatively, a data input/output (I/O) circuit (not shown) may be additionally disposed to receive/output data during a read or write operation. During the write operation, the data I/O circuit may receive write data from the memory controller 120, and transfer the write data to the memory cell array 112. During the read operation, the data I/O circuit may output read data from the memory cell array 112 to the memory controller 120.

The redundancy information storing circuit 118 may store fail information detected during a test operation at wafer level or a test operation at package level. The fail information may include a row address and/or a column address of a fail cell. Although FIG. 1 shows the redundancy information storing circuit 118 disposed in each of the banks BK0 to BKx, the present invention is not limited to this configuration. In another embodiment, one redundancy information storing circuit 118 may be disposed in common with the banks BK0 to BKx. The fail information may include a bank address of the fail cell in addition to the row address and/or the column address of the fail cell.

The redundancy information storing circuit 118 may be implemented with a non-volatile memory. The non-volatile memory may include an array e-fuse (ARE) circuit, a laser fuse circuit, a NAND flash memory, a NOR flash memory, PCRAM, ReRAM, FeRAM, MRAM, and/or STT-MRAM. The redundancy information storing circuit 118 may store the fail information detected by several test operations, and provide the row repair information RED_R and the column repair information RED_C to the row control circuit 114 and the column control circuit 116 to perform the repair operation, respectively, according to repair information INF_R provided from the memory controller 120. Hereinafter, a case in which the redundancy information storing circuit 118 includes a fuse circuit consisting of fuse cells is described as an example.

The memory controller 120 may receive and provide a command, a control signal and an address from a host (not shown) to the memory device 110, thereby controlling overall operation of the memory device 110. During the write operation, the memory controller 120 may provide the write data together with the write command and the bank/row/column addresses from the host to the memory device 110. During the read operation, the memory controller 120 may provide the read command and the bank/row/column addresses from the host to the memory device 110, and transfer the read data to the host from the memory device 110. The memory controller 120 may provide the repair information INF_R for the repair operation to the memory device 110.

Hereinafter, the repair operation by the memory controller 120 is explained.

The memory controller 120 may include a built-in self-test (BIST) circuit 122 and a built-in redundancy analysis (BIRA) circuit 124.

The BIST circuit 122 may perform a test operation to the banks BK0 to BKx and generate fail addresses FADD for each of the banks BK0 to BKx. During the test operation, the BIST circuit 122 may detect fail cells by generating a test pattern and testing the memory device 110 using the test pattern. When the BIST circuit 122 detects any fail cell, the BIST circuit 122 may transfer the fail address FADD related to the fail cell to the BIRA circuit 124. In an embodiment, the BIST circuit 122 may include a command/address generator (not shown), a test pattern generator (not shown), and a fail detector (not shown). The command/address generator may generate the read/write command for testing, and the bank/row/column addresses for a target cell to be tested. The test pattern generator may generate a set test pattern. The fail detector may determine whether fail occurs by comparing the read data outputted from the memory device 110 with the test pattern written to the memory device 110, and provide the fail address FADD to the BIRA circuit 124, In an embodiment, the fail address FADD may include the bank/row/column addresses of the fail cell.

The BIRA circuit 124 may store a first spare count R_CNT by counting the number of repairable row spares, and store a second spare count C_CNT by counting the number of repairable column spares. The BIRA circuit 124 may generate the repair information INF_R to select an address to be repaired (referred to as a "target repair address") based on the fail addresses FADD for each bank, according to the first spare count R_CNT and the second spare count C_CNT.

The BIRA circuit 124 may include a fail address storing circuit 210, a redundancy information acquiring circuit 220, a counting information storing circuit 230, and a target selecting circuit 240.

The fail address storing circuit 210 may store the fail addresses FADD provided from the BIST circuit 122. The redundancy information acquiring circuit 220 may acquire information on the number of repairable row spares and the number of repairable column spares for each bank, from the redundancy information storing circuit 118. In an embodiment, the redundancy information acquiring circuit 220 may provide a test mode entry command to the memory device 110, and acquire the information from the redundancy information storing circuit 118 when the memory device 110 enters a test mode. The redundancy information acquiring circuit 220 may generate the first spare count R_CNT by counting the number of repairable row spares, and generate the second spare count C_CNT by counting the number of repairable column spares. The counting information storing circuit 230 may store the first spare count R_CNT and the second spare count C_CNT for each bank. The target selecting circuit 240 may generate the repair information INF_R based on the fail addresses FADD for each bank, according to the first spare count R_CNT and the second spare count C_CNT, and provide the repair information INF_R to the memory device 110.

Figure 2:
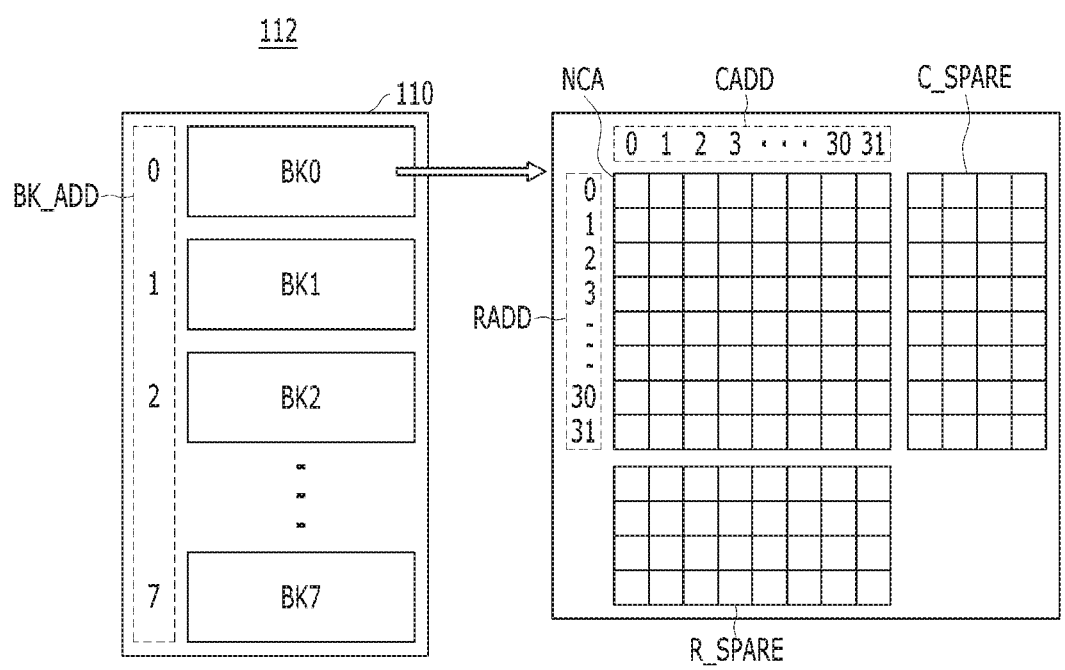
FIG. 2 is a diagram illustrating an address configuration allocated to a memory device, such as that of FIG. 1.

FIG. 2 is a diagram illustrating an address configuration allocated to the memory device 110 of FIG. 1.

Referring to FIG. 2, each of the banks BK0 to BKx of the memory device 110 may be specified by a bank address BK_ADD. For example, first to eighth banks BK0 to BK7 are disposed in the memory device 110, the first to eighth banks BK0 to BK7 are specified by a 3-bit bank address BK_ADD from "000" (i.e., decimal value "0") to "111" (i.e., decimal value "7"). That is, the bank address BK_ADD of "000" may be allocated to the first bank BK0. The memory cell array 112 of the first bank BK0 may include a normal cell array NCA, row spares R_SPARE, and column spares C_SPARE.

The normal cell array NCA may include a plurality of memory cells disposed in a matrix form defined by a plurality of rows (i.e., the normal word lines WL of FIG. 1) and a plurality of columns (i.e., the normal bit lines BL of FIG. 1). For example, when 32 rows and 32 columns are disposed in the normal cell array NCA, the memory cells at each row are specified by a 5-bit row address RADD from "00000" (i.e., decimal value "0") to "11111" (i.e., decimal value "31"), and the memory cells at each column are specified by a 5-bit column address CADD from "00000" (i.e., decimal value "0") to "11111" (i.e., decimal value "31"). That is, the 32 memory cells in a first row may be specified by the row address RADD of "00000". Likewise, the 32 memory cells in a first column may be specified by the column address CADD of "00000". The memory cells at a second row and a third column may be specified by both of the row address RADD of "00001" and the column address CADD of "00010".

The row spares R_SPARE may correspond to the redundant word line (e.g., RWL of FIG. 1). The row spares R_SPARE may replace a defective row including at least one fail cell among the memory cells of the normal cell array NCA. For example, any of the memory cells (i.e., specified by the row address RADD of "00011") at a fourth row is a fail cell, the fourth row may be replaced by one of the row spares R_SPARE. As a result, the memory cells at the fourth row may be replaced by spare cells at the row spare R_SPARE. Though FIG. 2 shows 4 row spares R_SPARE, the present invention is not limited to this arrangement, as the number of the row spares R_SPARE may be greater than or less than 4. In this embodiment, since only 4 rows in the normal cell array NCA may be replaced by the row spares R_SPARE, the repair operation cannot be performed by the row spares R_SPARE when the number of the rows having the fail cell in the normal cell array NCA exceeds 4. The number of columns at each row spare may be substantially the same as the number of columns at each row in normal cell array NCA.

The column spares C_SPARE may correspond to the redundant bit line (e.g., RBL of FIG. 1). The column spares C_SPARE may replace a defective column including at least one fail cell among the memory cells of the normal cell array NCA. For example, any of the memory cells (i.e., specified by the column address CADD of "00010") at the third column is a fail cell, the third column may be replaced by one of the column spares C_SPARE. As a result, the memory cells at the third column may be replaced by spare cells at the column spare C_SPARE. Though FIG. 2 shows 4 column spares C_SPARE, the present invention is not limited to this arrangement, as the number of the column spares C_SPARE is greater than or less than 4. In this embodiment, since only 4 columns in the normal cell array NCA may be replaced by the column spares C_SPARE, the repair operation cannot be performed by the column spares C_SPARE when the number of the columns having the fail cell in the normal cell array NCA exceeds 4. The number of rows at each column spare may be substantially the same as the number of rows at each column in normal cell array NCA.

In general, a large number of row spares and column spares may be allocated for a pre-packaging repair operation, followed by a small number of row spares and column spares separately for a post-package repair (PPR) operation. In the illustrated example of FIG. 2, two row spares R_SPARE and two column spares C_SPARE may be assigned for the pre-packaging repair operation, two row spares R_SPARE and two column spares C_SPARE may be assigned for the PPR operation.

Figure 3:
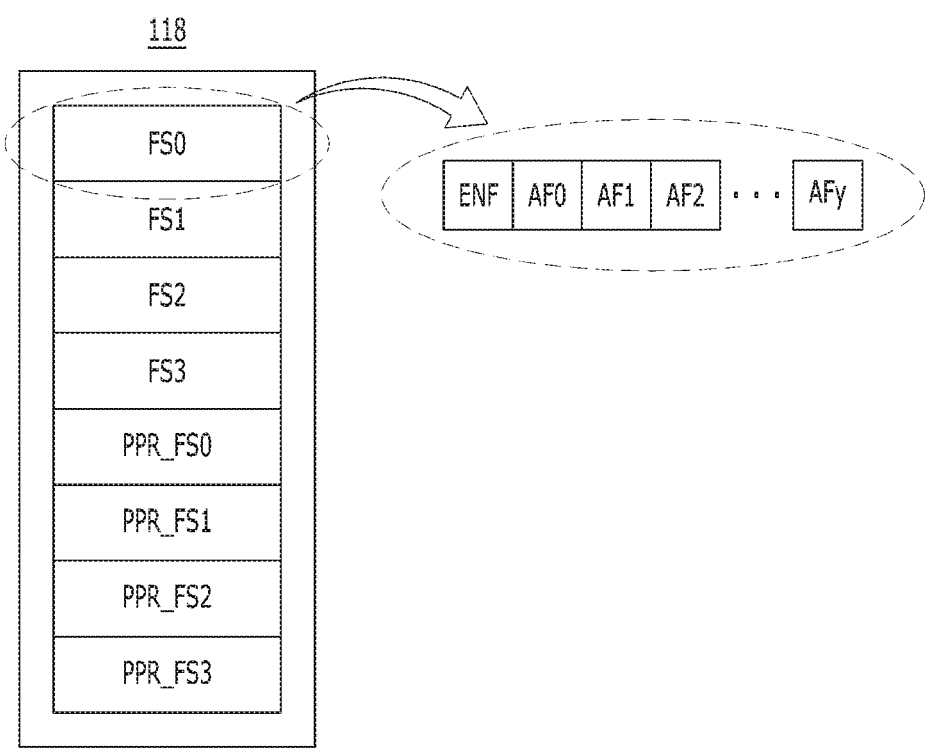
FIG. 3 is a diagram illustrating a redundancy information storing circuit, such as that of FIG. 1.

FIG. 3 is a diagram illustrating the redundancy information storing circuit 118 of FIG. 1.

Referring to FIG. 3, the redundancy information storing circuit 118 may include a plurality of memory sets for storing the fail information. Hereinafter, the memory sets are referred to as a plurality of fuse sets FS0 to FS3 and PPR_FS0 to PPR_FS3. Each of the fuse sets FS0 to FS3 and PPR_FS0 to PPR_FS3 may include an enable fuse ENF and a plurality of address fuses AF0 to AFy. The enable fuse ENF may program information on whether a corresponding fuse set stores valid fail information. For example, when the enable fuse ENF is programmed by a high bit, it is determined that the corresponding fuse set stores the valid fail information. The address fuses AF0 to AFy may program respective bits of the addresses of the fail information, and include fuse cells whose number corresponds to the bit number of the addresses. For example, when a 5-bit row address and a 5-bit column address are configured, each of the fuse sets includes first to tenth address fuses AF0 to AF9. When one redundancy information storing circuit 118 is disposed in common in all banks, additional address fuses for programming a bank address of the fail cell may be provided.

Referring back to FIG. 2, assuming that two row spares R_SPARE and two column spares C_SPARE are assigned to each bank for the pre-packaging repair operation, two row spares R_SPARE and two column spares C_SPARE are assigned to each bank for the PPR operation, 4 fuse sets FS0 to FS3 for the pre-packaging repair operation may be allocated in advance, and 4 fuse sets PPR_FS0 to PPR_FS3 for the PPR operation may be allocated in advance, to the redundancy information storing circuit 118. The redundancy information acquiring circuit 220 of the BIRA circuit 124 may check enable information on the enable fuse ENF of a low bit among all fuse sets FS0 to FS3 and PPR_FS0 to PPR_FS3, to thereby verify the number of repairable row spares and the number of repairable column spares for each bank. Hereinafter, it is assumed that 4 fuse sets FS0, FS1, PPR_FS0, and PPR_FS1 are allocated to the row spares, and the remaining 4 fuse sets FS2, FS3, PPR_FS2, and PPR_FS3 are allocated to the column spares.

FIG. 4 is a diagram illustrating the fail address storing circuit 210 of FIG. 1.

Referring to FIG. 4, the fail address storing circuit 210 may include a plurality of spare lines, and store the fail addresses FADD provided from the BIST circuit 122 to each of the spare lines. Each of the fail addresses FADD may include the bank address BK_ADD, the row address RADD, and the column address CADD of the fail cell. Each spare line of the fail address storing circuit 210 may be specified by fields, each storing the bank address BK_ADD, the row address RADD, and the column address CADD. For example, when the memory device 110 includes 8 banks, at least a 3-bit bank address BK_ADD may be stored in the field of each spare line. When 32 rows and 32 columns are disposed in each bank, at least 5-bit row address RADD and at least a 5-bit column address CADD may be stored in the respective fields of each spare line.

In an embodiment, the fail address storing circuit 210 may be implemented as a storing circuit such as a fuse circuit or a content addressable memory (CAM).

FIG. 5 is a diagram illustrating the counting information storing circuit 230 of FIG. 1.

Referring to FIG. 5, the counting information storing circuit 230 may include a plurality of count lines, each corresponding to the respective banks (e.g., 8). The counting information storing circuit 230 may store the first spare count R_CNT and the second spare count C_CNT for each bank in the respective count lines. For example, the counting information storing circuit 230 stores the first spare count R_CNT and the second spare count C_CNT for the first bank BK0 into a first count line. Assuming that 5 enable fuses ENF are programmed by a low bit among the fuse sets allocated to the row spares in a bank, the first spare count R_CNT for the bank may be set to "101". Assuming that 6 enable fuses ENF are programmed by a low bit among the fuse sets allocated to the column spares in a bank, the second spare count C_CNT for the bank may be set to "110".

Although FIG. 5 illustrates an arrangement in which each count line is composed of 6-bits, the present invention is not limited to this arrangement; the number of bits used in each count line may be adjusted according to the number of the fuse sets.

Figure 6A:
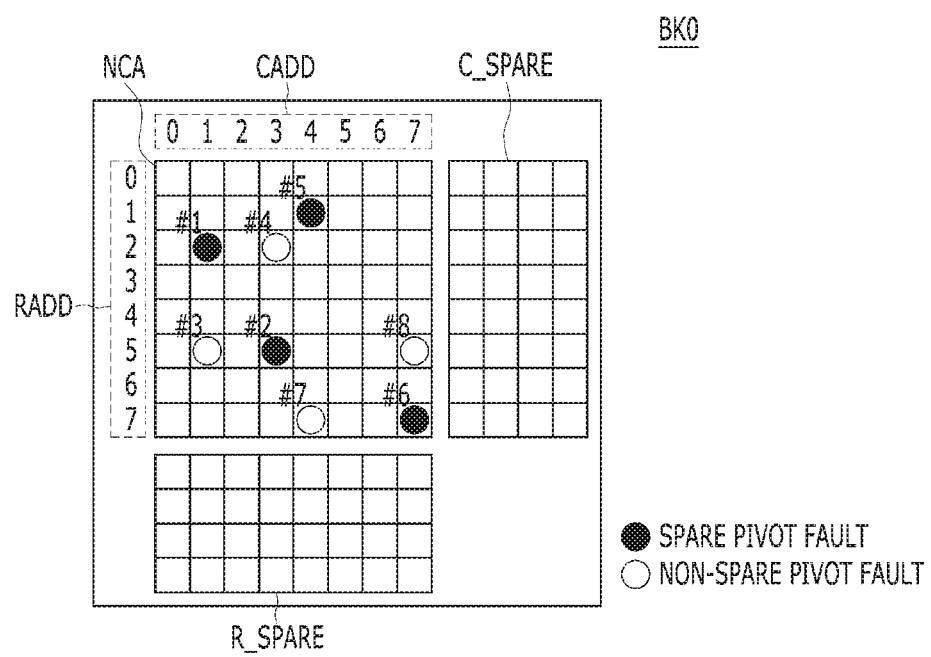

FIGS. 6A and 6B are diagrams illustrating a spare pivot and a non-spare pivot in accordance with an embodiment of the present invention.

Referring to FIG. 6A, the first bank BK0 including a normal cell array NCA composed of 8 rows and 8 columns is shown.

It is assumed that first to eighth fail cells from #1 to #8 are detected after the BIST circuit 122 performs a test operation on the first bank BK0. When detecting any fail cell, the BIST circuit 122 may provide the fail address FADD regarding thereto to the BIRA circuit 124. The BIRA circuit 124 may classify the fail cell as a spare pivot or a non-spare pivot. The spare pivot may be defined as a fail cell having a row address and a column address, which do not overlap with any of a row address and a column address of the previously detected fail cell. That is, a spare pivot may be a fail cell having a row address and a column address, different from the fail address of the previously detected fail cell. A non-spare pivot may be defined as a fail cell having a row address and a column address, which overlap with at least one of a row address and a column address of a previously detected fail cell. Each remaining fail cell is defined as a non-spare pivot.

Referring to FIG. 6B, the first fail cell #1 has a row address RADD "2" (hereinafter, expressed in decimal numbers) and a column address "1" (hereinafter, expressed in decimal numbers). That is, since the first fail cell #1 has a fail address (2, 1), the first fail cell #1 corresponds to a spare pivot. The second fail cell #2 having a fail address (5, 3) corresponds to a spare pivot since the second fail cell #2 has the row address "5" and the column address "3", which do not overlap with the row address "2" and the column address "1" of the first fail cell #1. On the contrary, the third fail cell #3 having a fail address (5, 1) corresponds to a non-spare pivot since the third fail cell #3 has the row address "5" overlapping with the row address of the second fail cell #2, and the column address "1" overlapping with the column address of the first fail cell #1. In this way, each of the fifth fail cell #5 and the sixth fail cell #6 correspond to a spare pivot, and each of the fourth fail cell #4, seventh fail cell #7, and eighth fail cell #8 correspond to a non-spare pivot.

A non-spare pivot may be in a cross state or in a non-cross state. A non-spare pivot may be in a cross state in the case in which the row address and the column address of the non-spare pivot overlap with the row address and the column address of a spare pivot. Thus, the row address of a non-spare pivot in the cross state overlaps with one of the row addresses in a spare pivot, and the column address also overlaps with one of the column addresses in a spare pivot. On the other hand, a non-spare pivot may be in a non-cross state in the case in which the row address or column address of the non-spare pivot does not overlap with the row address or column address of a spare pivot. Thus, only one of the row address and column address of a non-spare pivot in the non-cross state overlaps with the row address or column address of the spare pivot, and the other address does not overlap.

Figure 7:
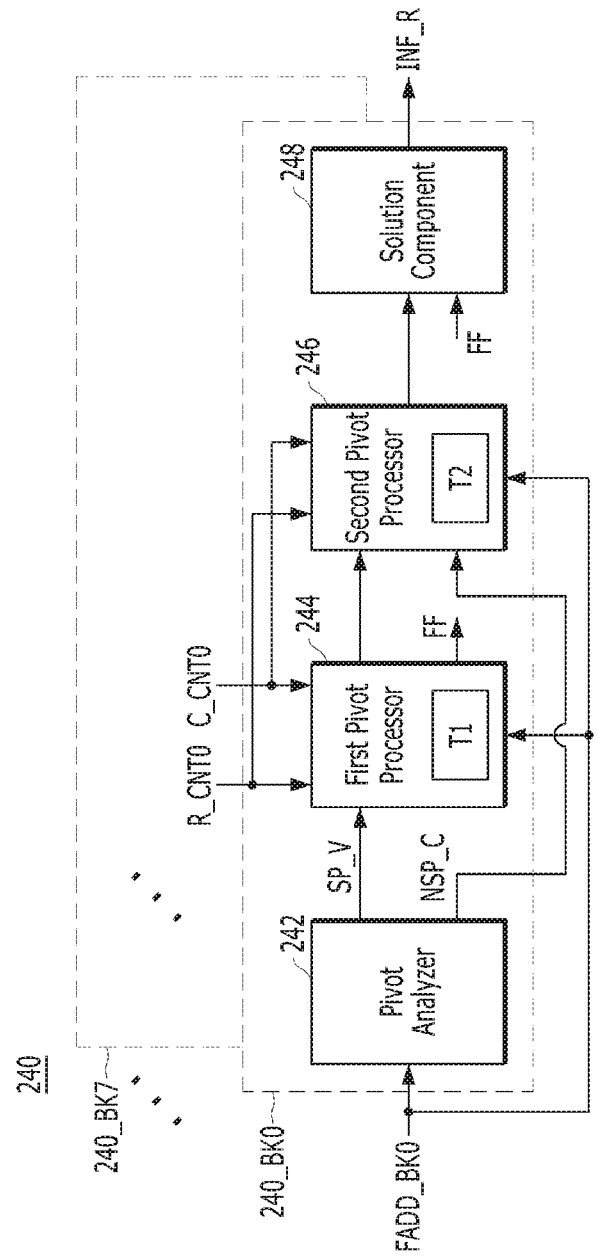
FIG. 7 is a diagram illustrating a target selecting circuit, such as that of FIG. 1.

FIG. 7 is a diagram illustrating the target selecting circuit 240 of FIG. 1.

Referring to FIG. 7, the target selecting circuit 240 may include a plurality of target selectors 240_BK0 to 240_BK7 corresponding to the banks. For example, when the memory device 110 includes 8 banks, the target selecting circuit 240 may include first to eighth target selectors 240_BK0 to 240_BK7. Since the first to eighth target selectors 240_BK0 to 240_BK7 may have substantially the same structure, the first target selector 240_BK0 is described as an example.

The first target selector 240_BK0 may receive a fail address FADD_BK0 for the first bank BK0 from the fail address storing circuit 210, and receive a first spare count R_CNT0 and a second spare count C_CNT0 for the first bank BK0 from the counting information storing circuit 230. The first target selector 240_BK0 may generate the repair information INF_R to select a target repair address from the fail address FADD_BK0, according to the first spare count R_CNT0 and the second spare count C_CNT0, and provide the repair information INF_R to the first bank BK0 of the memory device 110.

In an embodiment, the first target selector 240_BK0 may include a pivot analyzer 242, a first pivot processor 244, a second pivot processor 246, and a solution component 248.

The pivot analyzer 242 may receive the fail address FADD_BK0 from the fail address storing circuit 210, and output a spare valid bit SP_V based on determining whether the fail address FADD_BK0 corresponds to a spare pivot or a non-spare pivot. Further, when it is determined that the fail address FADD_BK0 corresponds to the non-spare pivot, the pivot analyzer 242 may output a non-spare state bit NSP_C based on determining whether the non-spare pivot is in a cross state or in a non-cross state. The pivot analyzer 242 may output the spare valid bit SP_V as a high bit when the fail address FADD_BK0 corresponds to the spare pivot, and output the non-spare state bit NSP_C as a high hit when the fail address FADD_BK0 is the non-spare pivot in the cross state.

The first pivot processor 244 may process the spare pivot, according to the first spare count R_CNT0 and the second spare count C_CNT0, the spare valid bit SP_V, and the fail address FADD_BK0. The first pivot processor 244 may include a first table T1. The first pivot processor 244 may receive the first spare count R_CNT0 and the second spare count C_CNT0 from the counting information storing circuit 230, to set a size of the first table T1. In an embodiment, the first pivot processor 244 may set the size of the first table T1 to include a plurality of row lines whose number corresponds to a sum (i.e., R_CNT+C_CNT) of the first spare count R_CNT0 and the second spare count C_CNT0. The first pivot processor 244 may store the fail address FADD_BK0 in the row lines of the first table T1, according to the spare valid hit SP_V. The first pivot processor 244 may output a flag signal FF to the solution component 248 when the first table T1 is full.

The second pivot processor 246 may process the non-spare pivot in the cross state, according to a result of the first pivot processor 244, the first spare count R_CNT0, the second spare count C_CNT0, the non-spare state bit NSP_C, and the fail address FADD_BK0. The second pivot processor 246 may include a second table T2. The second pivot processor 246 may receive the first spare count R_CNT0 and the second spare count C_CNT0 from the counting information storing circuit 230, to set a size of the second table T2. In an embodiment, the second pivot processor 246 may set the size of the second table T2 to include a plurality of row lines and column lines, each of which has the number corresponding to a sum (i.e., R_CNT+C_CNT) of the first spare count R_CNT0 and the second spare count C_CNT0. The second pivot processor 246 may define fields of the row lines and the column lines of the second table T2 according to the result of the first pivot processor 244, and update the fields with the fail address FADD_BK0 according to the non-spare state bit NSP_C.

The solution component 248 may select the target repair address according to a result of the second pivot processor 246. The solution component 248 may generate the repair information INF_R base on the second table T2, and provide the repair information INF_R to the first bank BK0. The solution component 248 may provide the repair information INF_R including repair failure information when the flag signal FF denotes that the first table T1 is full. That is, when the number of the fail addresses FADD classified as spare pivots is greater than the sum (R_CNT+C_CNT) of the first spare count R_CNT and the second spare count C_CNT, the solution component 248 may generate the repair information INF_R not to select the target repair address. Accordingly, the memory device 110 does not perform the repair operation.

Figure 8:
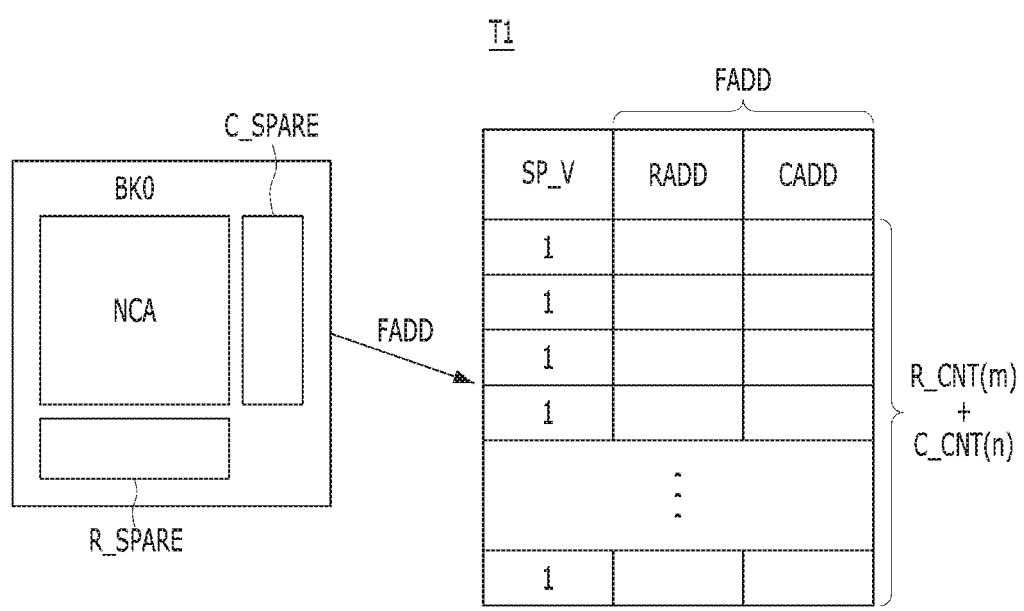
FIG. 8 is a diagram illustrating a first pivot processor, such as that of FIG. 7.

FIG. 8 is a diagram illustrating the first pivot processor 244 of FIG. 7.

Referring to FIG. 8, the first pivot processor 244 may determine the size of the first table T1 to include the row lines corresponding to a sum (m+n) of the first spare count R_CNT0 and the second spare count C_CNT0. That is, the size of the first table T1 may be determined as the product of the sum (m+n) and the bit number of the fail address FADD. The first pivot processor 244 may store the fail address FADD_BK0 in the row lines of the first table T1, when the spare valid bit SP_V is set to a high bit. The fail address FADD_BK0 may include a row address RADD and a column address CADD.

As described above, the first table T1 may have an adjustable size according to the first spare count R_CNT0 and the second spare count C_CNT0. The first table T1 may store the valid spare pivot as many as the sum (m+n) of the first spare count R_CNT0 and the second spare count C_CNT0. When the fail address FADD_BK0 of the spare pivot exceeding the sum (m+n) occurs, the repair operation may not be performed.

Figure 9:
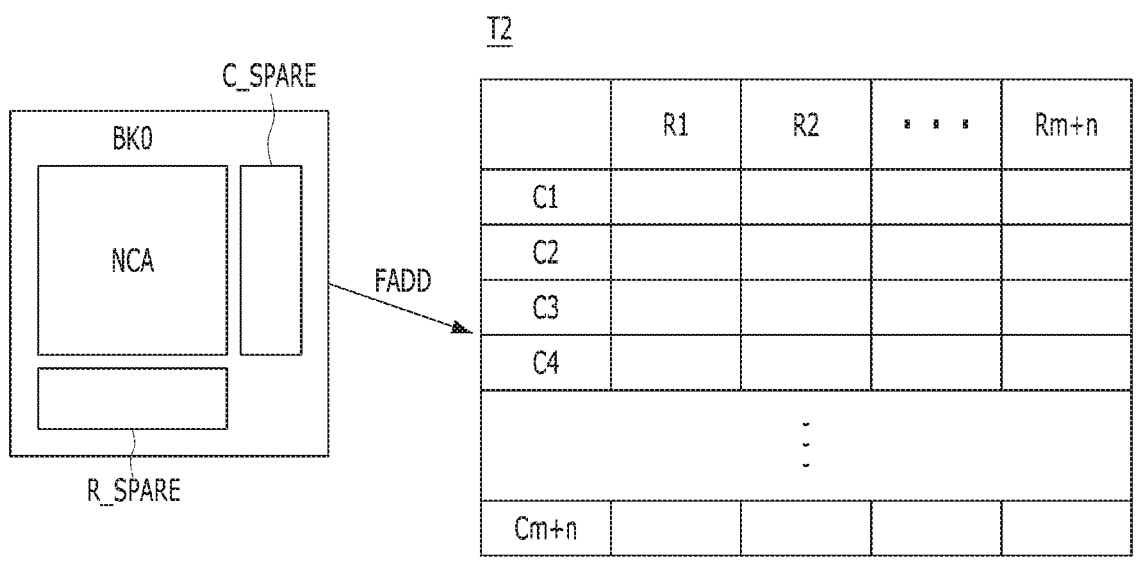
FIG. 9 is a diagram illustrating a second pivot processor, such as that of FIG. 7.

FIG. 9 is a diagram illustrating the second pivot processor 246 of FIG. 7.

Referring to FIG. 9, the second pivot processor 246 may determine the size of the second table T2 to include the row lines R1 to Rm+n and the column lines C1 to Cm+n, each corresponding to a sum (m+n) of the first spare count R_CNT0 and the second spare count C_CNT0. That is, the size of the second table T2 may be determined as (m+n)^2. The second pivot processor 246 may define the fields of the row lines R1 to Rm+n and the column lines C1 to Cm+n of the second table T2 according to the result of the first pivot processor 244. For example, when the row address RADD and the column address CADD at a first row line of the first table T1 of the first pivot processor 244 are (2, 3), the second pivot processor 246 may define a first row line R1 as "2" of the second table T2 and define a first column line C1 as "3" of the second table T2. The second pivot processor 246 may update the fields of the second table T2 with the fail address FADD_BK0 according to the non-spare state bit NSP_C. For example, when the non-spare state bit NSP_C is set to a high bit, the second pivot processor 246 may update the fields corresponding to the row address RADD and the column address CADD of the fail address FADD_BK0, to a high bit.

As described above, the second table T2 may have an adjustable size according to the first spare count R_CNT0 and the second spare count C_CNT0. In one type of memory system that has been proposed, as illustrated in FIG. 3, even if there were still unused fuse sets among the fuse sets assigned during the pre-packaging operation, only four pre-assigned fuse sets PPR_FS0 to PPR_FS3 may be used for the PPR operations. In other words, first table T1 may only contain four row lines fixed for the PPR operation, thereby allowing the second table T2 to have a fixed size of four row lines and four column lines. As a result, despite the presence of actually available rows or column spares, the repair operation could not be performed on the fail cell when exceeding four row or column spares assigned to the PPR operation. Thus, repair efficiency has been reduced.

On the contrary, in an embodiment of the present invention, the BIRA circuit 124 may identify the unused fuse sets among the total fuse sets FS0 to FS3 and PPR_FS0 to PPR_FS3, and, based on this, adjust the size of the first table T1 and the second table T2. As a result, the repair efficiency may be improved by identifying the repairable row spares and column spares and performing the repair operation in a flexible manner.

Hereinafter, referring to FIGS. 1 to 10, an operation of a memory system in accordance with an embodiment is described.

Figure 10:
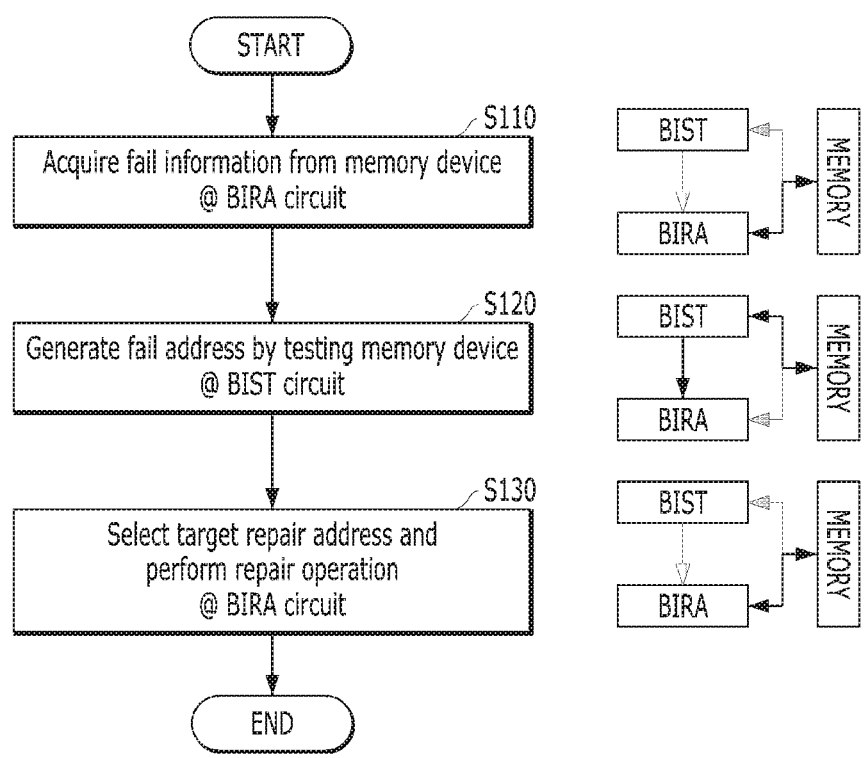
FIG. 10 is a flow chart illustrating an operation of a memory system in accordance with an embodiment of the present invention.

FIG. 10 is a flow chart illustrating an operation of a memory system in accordance with an embodiment of the present invention.

Referring to FIG. 10, the BIRA circuit 124 may acquire the fail information from the memory device 110 (at operation S110). The redundancy information acquiring circuit 220 of the BIRA circuit 124 may acquire information on the number of repairable row spares and the number of repairable column spares for each bank, from the redundancy information storing circuit 118. The redundancy information acquiring circuit 220 may generate the first spare count R_CNT by counting the number of repairable row spares, and generate the second spare count C_CNT by counting the number of repairable column spares. The counting information storing circuit 230 may store the first spare count R_CNT and the second spare count C_CNT for each bank.

At operation S120, the BIST circuit 122 may perform a test operation to the banks BK0 to BKx and generate fail addresses FAD© for each bank. The BIST circuit 122 may detect fail cells by generating a test pattern and testing the memory device 110 using the test pattern. When the BIST circuit 122 detects any fail cell, the BIST circuit 122 may transfer the fail address FADD related to the fail cell to the BIRA circuit 124. The fail address storing circuit 210 of the BIRA circuit 124 may store the fail addresses FADD provided from the BIST circuit 122.

At operation S130, the target selecting circuit 240 of the BIRA circuit 124 may generate the repair information INF_R to select a target repair address from the fail addresses FADD for each bank, according to the first spare count R_CNT and the second spare count C_CNT. Further, the target selecting circuit 240 may provide the repair information INF_R to the memory device 110 to perform a repair operation. The target selecting circuit 240 may analyze the fail address FADD_BK0 to provide the repair information INF_R including repair failure information so as not to select the target repair address, when the number of the fail addresses FADD determined as spare pivots is greater than a sum (R_CNT+C_CNT) of the first spare count R_CNT and the second spare count C_CNT. Accordingly, the memory device 110 does not perform the repair operation.

Hereinafter, referring to FIGS. 1 to 13, a redundancy analysis operation in accordance with an embodiment is described.

Figure 11:
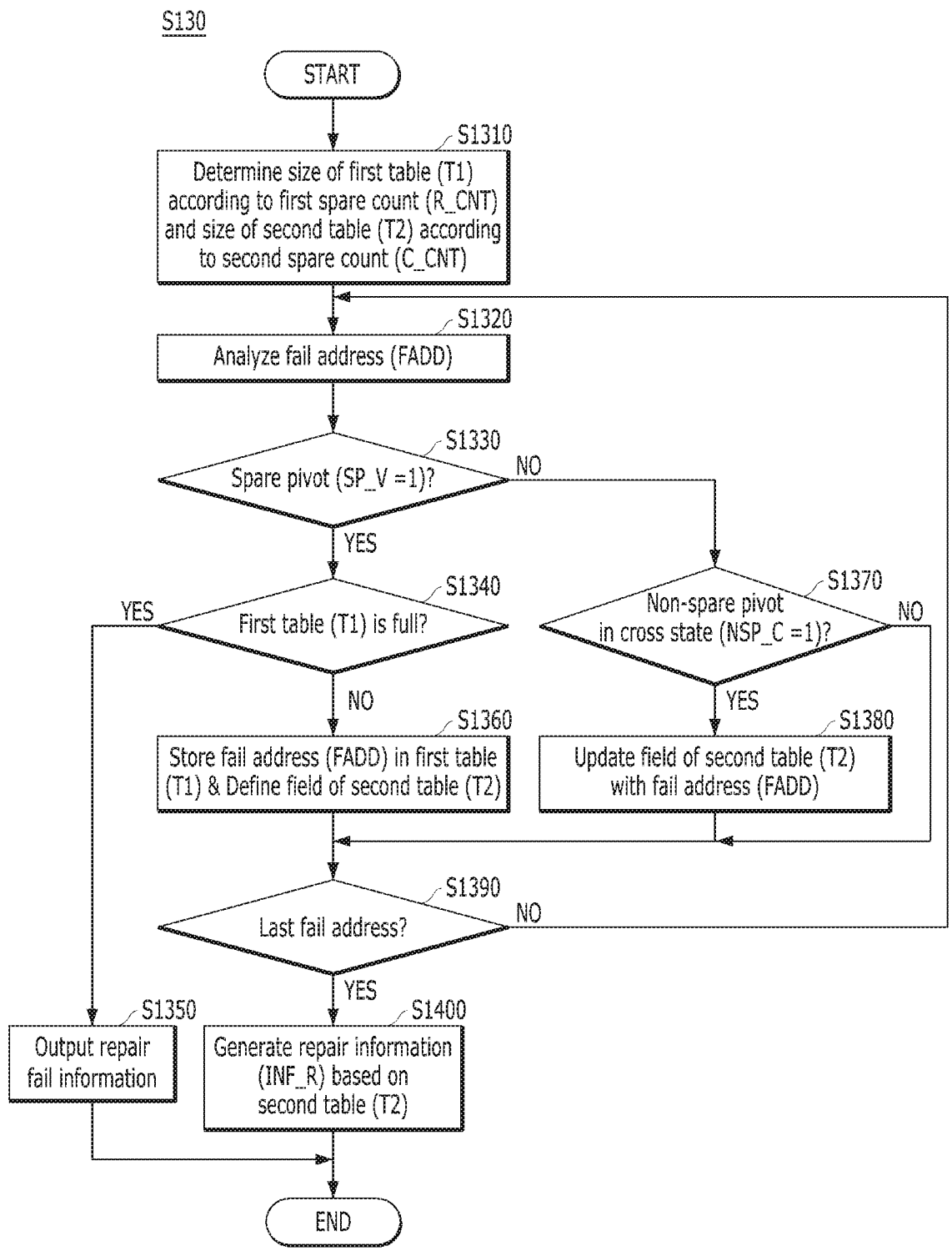
FIG. 11 is a flow chart illustrating a redundancy analysis operation in accordance with an embodiment of the present invention.

FIG. 11 is a flow chart for describing a redundancy analysis operation in accordance with an embodiment of the present invention.

Referring to FIG. 11, the operation S130 of selecting the target repair address and performing the repair operation is illustrated in detail. In FIG. 11, a case in which the redundancy analysis operation is performed on the first bank BK0 is described.

At operation S1310, the first pivot processor 244 may determine the size of the first table T1, and the second pivot processor 246 may determine the size of the second table T2, according to the first spare count R_CNT0 and the second spare count C_CNT0 corresponding to the first bank BK0.

At operation S1320, the pivot analyzer 242 may receive and analyze the fail address FADD_BK0 for the first bank BK0. The pivot analyzer 242 may determine whether the fail address FADD_BK0 corresponds to a spare pivot or a non-spare pivot, to output a spare valid bit SP_V. When it is determined that the fail address FADD_BK0 corresponds to a non-spare pivot, the pivot analyzer 242 may determine whether the non-spare pivot is in a cross state or in a non-cross state, to output a non-spare state bit NSP_C. The pivot analyzer 242 may output a spare valid bit SP_V as a high bit when the fail address FADD_BK0 corresponds to a spare pivot, and output a non-spare state bit NSP_C as a high bit when the fail address FADD_BK0 corresponds a non-spare pivot in the cross state.

When the fail address FADD_BK0 corresponds to a spare pivot ("YES" at S1330), at operation S1340, the first pivot processor 244 may determine whether the first table T1 is full or not. When the first table T1i is full ("YES" at S1340), at operation 51350, the first pivot processor 244 may output a flag signal FF to the solution component 248, and the solution component 248 may output the repair information INF_R including the repair failure information to the first bank BK0. When the first table T1 is not full ("NO" at S1340), at operation S1360, the first pivot processor 244 may store the fail address FADD_BK0 in the row lines of the first table T1 according to the spare valid bit SP_V. Further, at operation S1360, the second pivot processor 246 may define the fields of the row lines R1 to Rm+n and the column lines C1 to Cm+n of the second table T2 according to the result of the first pivot processor 244.

When the fail address FADD_BK0 does not correspond to a spare pivot ("NO" at S1330), but corresponds to a non-spare pivot in the cross state ("YES" at S1370), at operation S1380, the second pivot processor 246 may update the fields of the second table T2 corresponding to the row address RADD and the column address CADD of the fail address FADD_BK0, to a high bit. When fail address FADD_BK0 corresponds to a non-spare pivot in the non-cross state ("NO" at S1370), the second pivot processor 246 may not update the fields of the second table T2.

After sequentially performing the above operations S1320 to S1380 on all the fail addresses FADD_BK0 for the first bank BK0 ("YES" of S1390), at operation S1400, the solution component 248 may generate the repair information INF_R based on the second table T2, and provide the repair information INF_R to the first bank BK0.

Figure 12B:
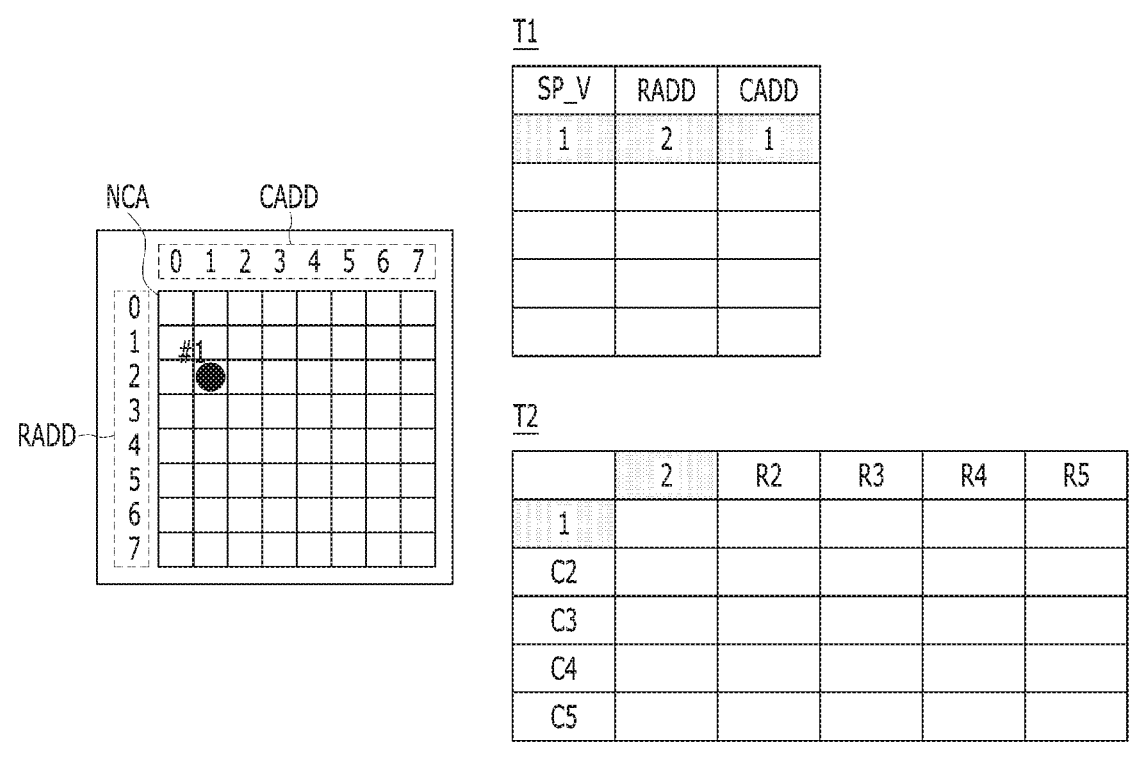
Figure 12C:
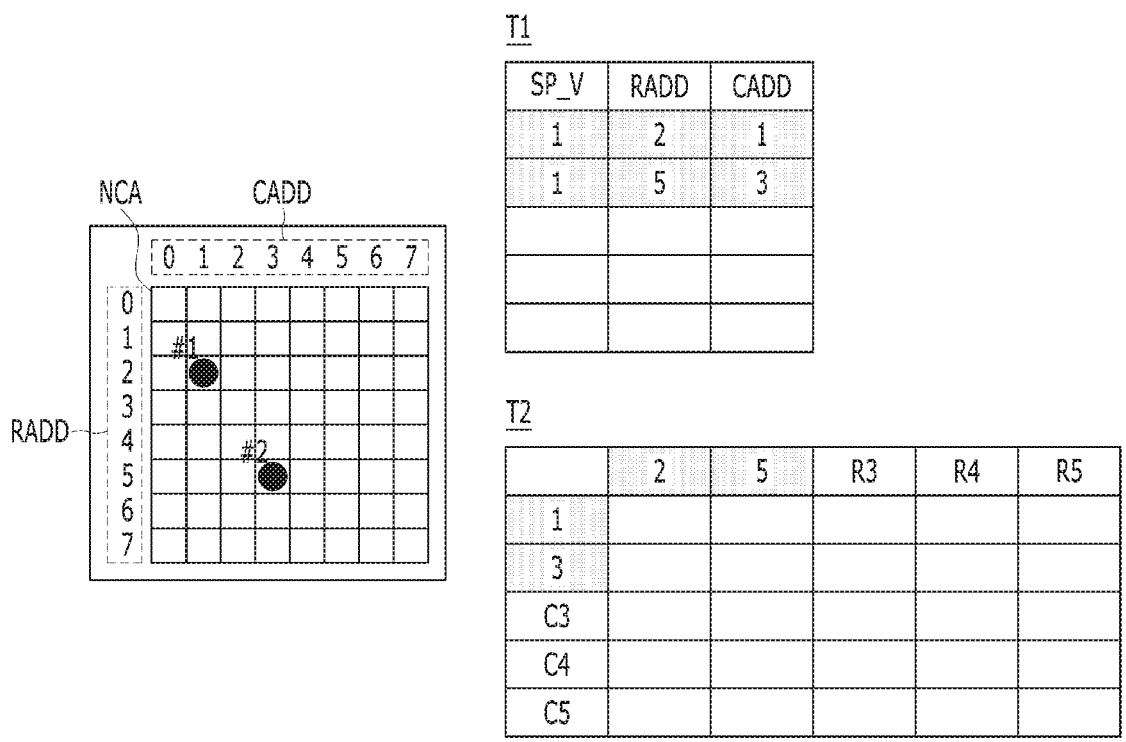
FIGS. 12A to 13 are diagrams illustrating a redundancy analysis operation in accordance with an embodiment of the present invention.
Figure 12D:
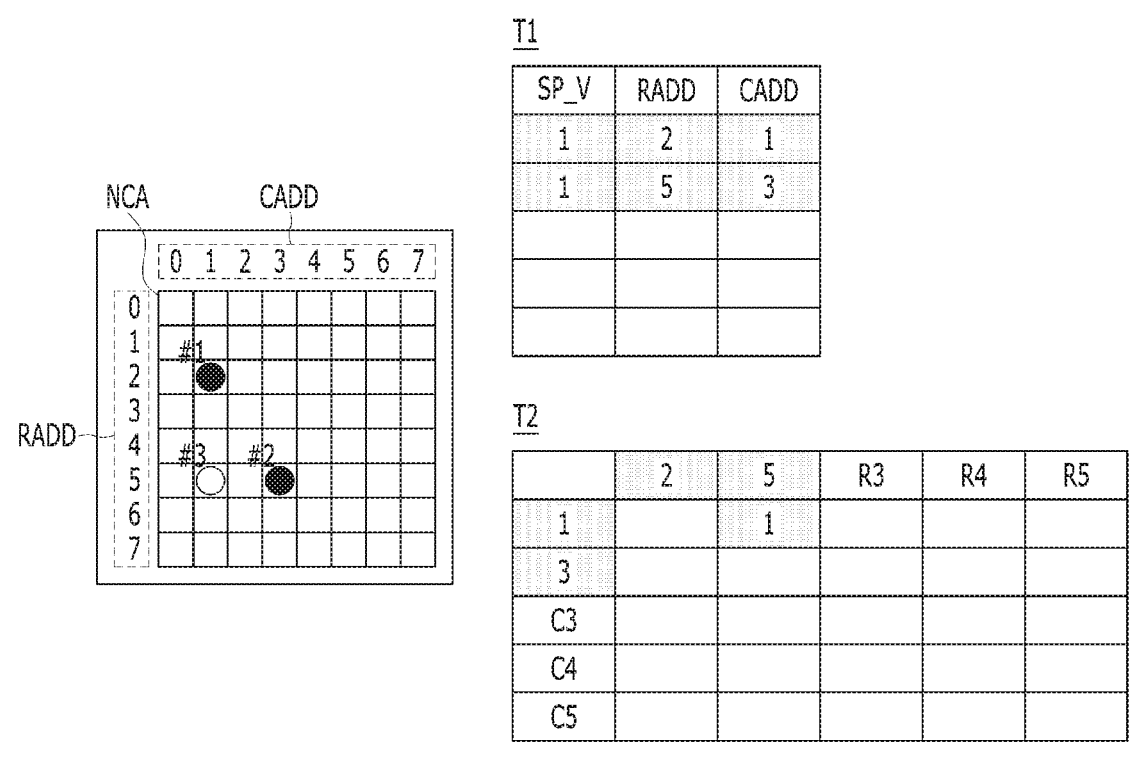
Figure 12E:
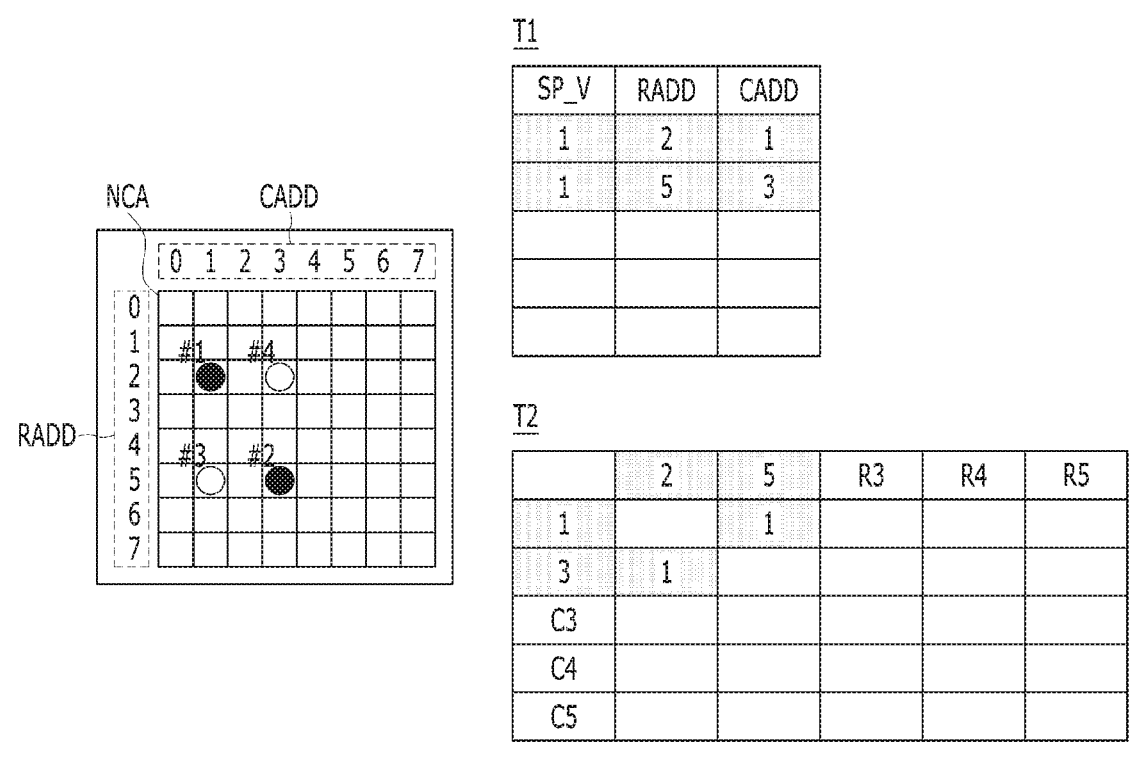
Figure 12F:
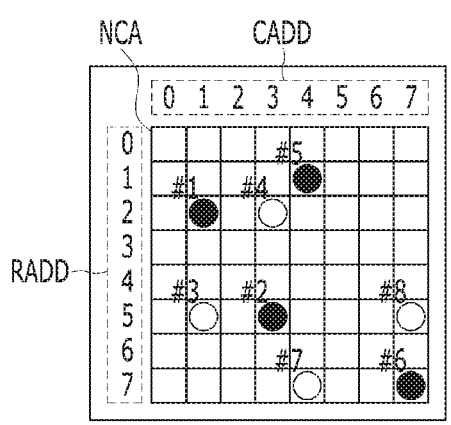
Figure 12G:
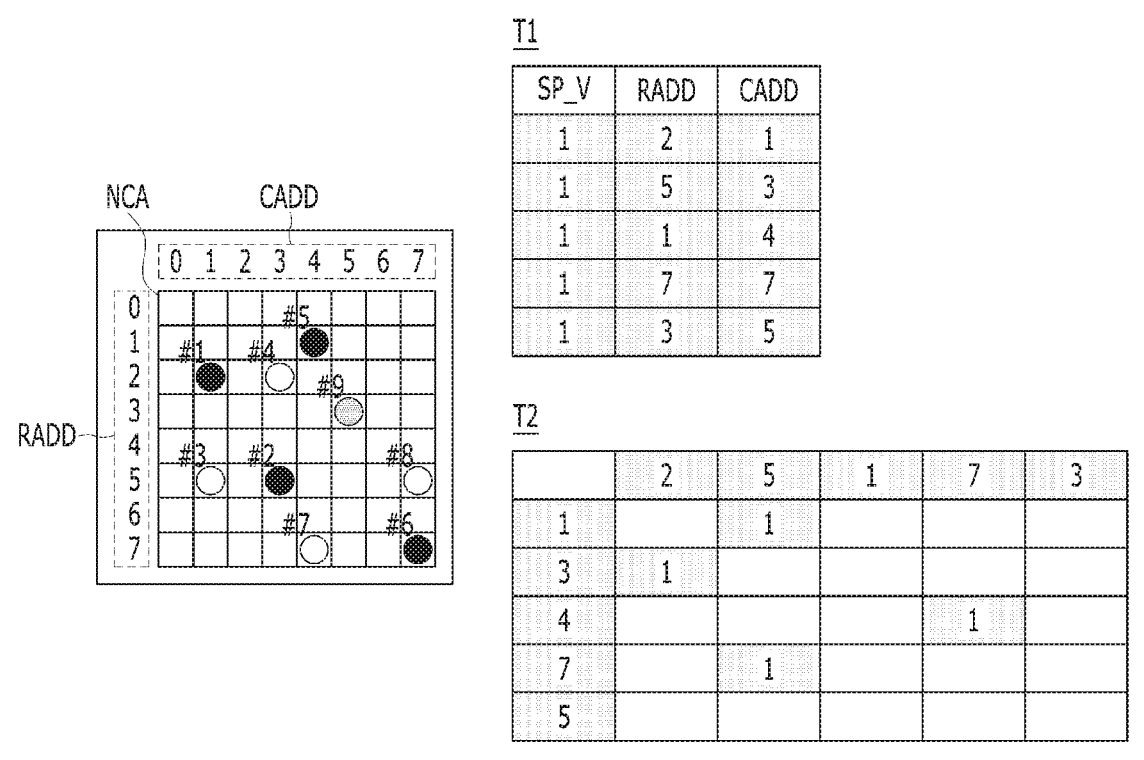
Figure 13:
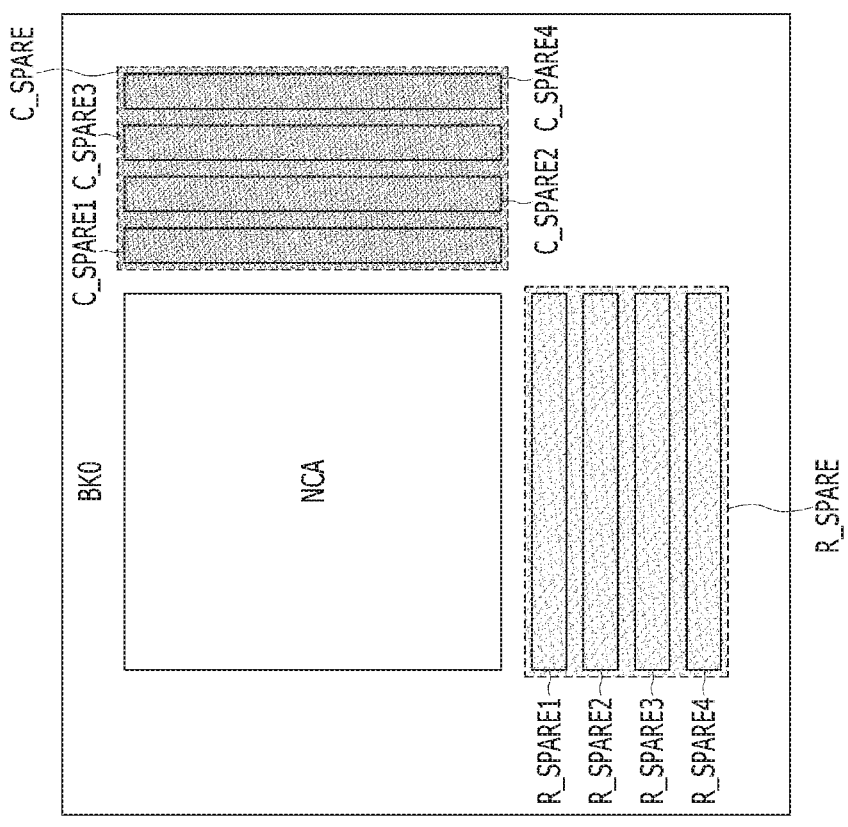

FIGS. 12A to 13 diagrams illustrating a redundancy analysis operation in accordance with an embodiment of the present invention.

Referring to FIGS. 12A to 13, a case in which the redundancy analysis operation on the first bank BK0 including the normal cell array NCA composed of 8 rows and 8 columns is described. It is assumed that the first spare count R_CNT0 is set to "010" (i.e., decimal value "2"), and the second spare count C_CNT0 is set to "011" (i.e., decimal value "3").

Referring to FIG. 12A, the first table T1 may include 5 row lines whose number corresponds to a sum of the first spare count R_CNT0 and the second spare count C_CNT0. The second table T2 may include 5 row lines R1 to R5 and 5 column lines C1 to C5, each of which has the number corresponding to the sum of the first spare count R_CNT0 and the second spare count C_CNT0.

Referring to FIG. 12B, a first fail cell #1 assigned by a row address RADD "2" (hereinafter, expressed in decimal numbers) and a column address CADD "1" (hereinafter, expressed in decimal numbers) is detected by the BIST circuit 122. Since the first fail cell #1 has a fail address (2, 1) and corresponds to a spare pivot, the spare valid bit SP_V is set to a high bit. As a result, the fail address (2, 1) of the first fail cell #1 is stored in a first row line of the first table T1, and a first row line R1 and a first column line C1 of the second table T2 are defined by the fail address (2, 1) of the first fail cell #1.

Referring to FIG. 12C, a second fail cell #2 assigned by a row address RADD "5" and a column address CADD "3" is detected. Since the second fail cell #2 has a fail address (5, 3), which do not overlap with the row address "2" and the column address "1" of the first fail cell #1, the second fail cell #2 corresponds to a spare pivot, and thus the spare valid bit SP_V is set to a high hit. As a result, the fail address (5, 3) of the second fail cell #2 is stored in a second row line of the first table T1, and a second row line R2 and a second column line C2 of the second table T2 are defined by the fail address (5, 3) of the second fail cell #2.

Referring to FIG. 12D, a third fail cell #3 assigned by a row address RADD "5" and a column address CADD "1" is detected. Since the third fail cell #3 has the row address "5" overlapping with the row address of the second fail cell #2, and the column address "1" overlapping with the column address of the first fail cell #1, the third fail cell #3 corresponds to a non-spare pivot in the cross state, and thus the non-spare state bit NSP_C is set to a high bit. As a result, a field where the second row line R2 and the first column line C1 of the second table T2 are cross, is updated to a high bit.

Referring to FIG. 12E, a fourth fail cell #4 assigned by a row address RADD "2" and a column address CADD "3" is detected and determined to be a non-spare pivot in the cross state. As a result, a field where the first row line R1 and the second column line C2 of the second table T2 are cross, is updated to a high bit.

In this way, referring to FIG. 12F, a fifth fail cell #5 assigned by a fail address (1, 4) is determined to be a spare pivot. The fail address (1, 4) of the fifth fail cell #5 is stored in a third row line of the first table T1, and a third row line R3 and a third column line C3 of the second table T2 are defined by the fail address (1, 4) of the fifth fail cell #5.

Likewise, a sixth fail cell #6 assigned by a fail address (7, 7) is determined to be a spare pivot. The fail address (7, 7) of the sixth fail cell #6 is stored in a fourth row line of the first table T1, and a fourth row line R4 and a fourth column line C4 of the second table T2 are defined by the fail address (7, 7) of the sixth fail cell #6.

Further, a seventh fail cell #7 assigned by a fail address (7, 4) is determined to be a non-spare pivot in the cross state, and thus a field where the fourth row line R4 and the third column line C3 of the second table T2 are cross, is updated to a high bit. Likewise, an eighth fail cell #8 assigned by a fail address (5, 7) is determined to be a non-spare pivot in the cross state, and thus a field where the second row line R2 and the fourth column line C4 of the second table T2 are cross, is updated to a high bit.

Referring to FIG. 12G, a ninth fail cell #9 assigned by a fail address (3, 5) is determined to be a spare pivot. The fail address (3, 5) of the ninth fail cell #9 is stored in a fifth row line of the first table T1, and a fifth row line R5 and a fifth column line C5 of the second table T2 are defined by the fail address (3, 5) of the ninth fail cell #9.

Thereafter, when an additional fail cell is detected and determined to be a spare pivot, a flag signal FF is generated, and thus the solution component 248 outputs the repair information INF_R including the repair failure information to the first bank BK0. A fail cell determined to be a spare pivot may be not repaired, but a fail cell determined to be a non-spare pivot may be repaired.

Referring to FIG. 13, the solution component 248 may generate the repair information INF_R to select the target repair address based on the second table T2, and provide the repair information INF_R to the first bank BK0 of the memory device 110. The solution component 248 may mark the fields of the second table T2, which correspond to the row address RADD and the column address CADD of the spare pivot, as an indicator "X". That is, the indicator "X" may be marked along with a diagonal direction of the second table T2. The solution component 248 may derive the repair information INF_R such that the fields where the indicator "X" and a high bit "1" exist are selected. For example, it is assumed that two row spares R_SPARE1 and R_SPARE2 and two column spares C_SPARE1 and C_SPARE2 are assigned for a pre-packaging repair operation, two row spares R_SPARE3 and R_SPARE4 and two column spares C_SPARE3 and C_SPARE4 are assigned for a PPR operation, and the column spare C_SPARE2 is actually unused and can be used for a repair operation during the PPR operation. The solution component 248 generates the repair information INF_R such that the row addresses RADD "2" and "5" are respectively replaced with the row spares R_SPARE3 and R_SPARE4 assigned for the PPR operation. Further, the solution component 248 generates the repair information INF_R such that the column addresses CAD© "4", "7" and "5" are respectively replaced with not only the column spares C_SPARE3 and C_SPARE4, but also the column spare C_SPARE2.

As described above, in a redundancy analysis operation that has been proposed, since the first table T1 only contains four row lines fixed for the PPR operation, it is difficult to store any more spare pivots. Thus, the solution component 248 outputs the repair information INF_R including the repair failure information to the first bank BK0. On the contrary, in an embodiment of the present invention, the size of the first table T1 is adjusted to be increased by the number of the repairable row spares and column spares, and it is possible to store more spare pivots. Thus, the repair efficiency may be improved.

Figure 14:
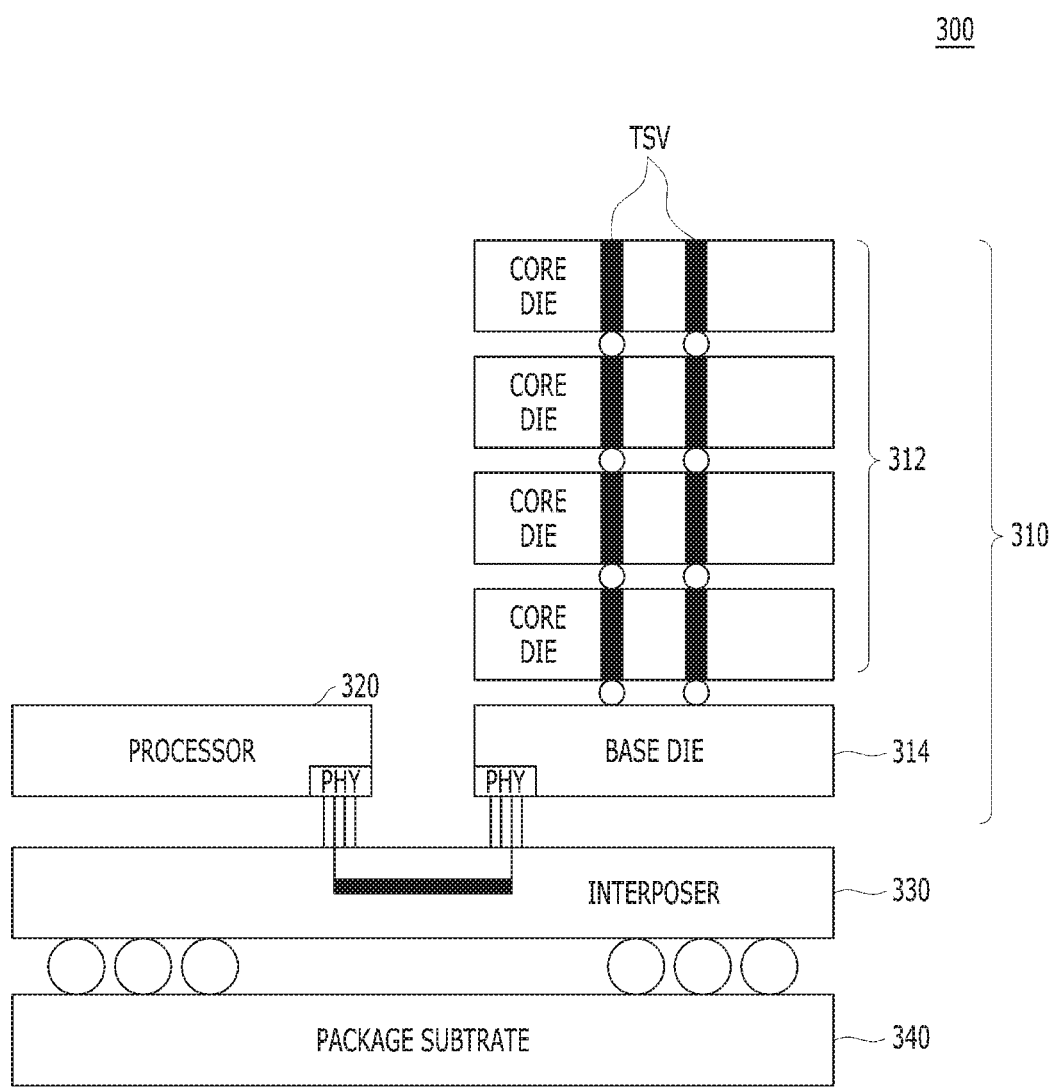
FIG. 14 is a diagram illustrating a memory package in accordance with an embodiment of the present invention.

FIG. 14 is a diagram illustrating a memory package 300 in accordance with an embodiment of the present invention.

Referring to FIG. 14, the memory package 300 may include a memory device 310, a memory controller 320, an interposer 330, and a package substrate 340. The memory device 310 of the memory package 300 may include a stacked memory device.

The interposer 330 may be mounted onto the package substrate 340.

The memory device 310 and the memory controller 320 may be separately mounted onto the interposer 330.

The memory controller 320 may be implemented as any of a variety of processors, such as a central processing unit (CPU), a graphic processing unit (GPU), and an application processor (AP). Thus, the memory controller 320 may be referred to as a processor as designated in FIG. 14.

A physical area (PHY) of the memory device 310 may be coupled to a physic& area (PHY) of the memory controller 320 via the interposer 330. An interface circuit for enabling communication between the memory device 310 and the memory controller 320 may be disposed in each of the physical areas PHY.

The memory device 310 may be a high bandwidth memory (HBM) formed by a plurality of dies stacked in a vertical direction and electrically connected via through-electrodes or through silicon vias (TSVs). The stacked dies provide the HBM memory device 310 with an increased number of I/O units, which in turn enables the HBM memory device 310 to operate at high bandwidth.

The plurality of dies may include a base logic die 314 (also referred to simply as base die) and a plurality of core dies 312. The core dies 312 may be sequentially stacked over the base die 314, and coupled to each other via the through-electrodes TSVs. Although FIG. 14 shows four stacked core dies 312, the present disclosure is not limited thereto. It is noted that the number of the stacked core dies may vary depending on the design of the memory device.

Each of the core dies 312 may be implemented with a memory chip. Each of the core dies 312 may include a plurality of memory cells for storing data and circuits for supporting a core operation on the memory cells. The base die 314 may act as an interface between the core dies 312 and the memory controller 320 so that various functions within the memory package 300, such as a memory management function (e.g., a refresh management function and a power management function for the memory cells), and a timing adjustment function between the core dies 312 and the memory controller 320, may be performed.

In an embodiment of the present invention, each of the core dies 312 may correspond to the memory device 110 of FIG. 1, and the memory controller 320 may correspond to the memory controller 120 of FIG. 1. Accordingly, the memory controller 320 may include a BIST circuit and a BIRA circuit. The BIRA circuit may respectively store first and second spare counts R_CNT and C_CNT by counting the number of repairable row spares and column spares, and generate repair information INF_R to select a target repair address based on a fail address FADD for each bank, according to the first and second spare counts R_CNT and C_CNT. The base die 314 may receive and transfer the repair information INF_R to the core dies 312, and each of the core dies 312 may perform a repair operation to replace defective rows or columns with row and column spares, according to the repair information INF_R.

Figure 15:
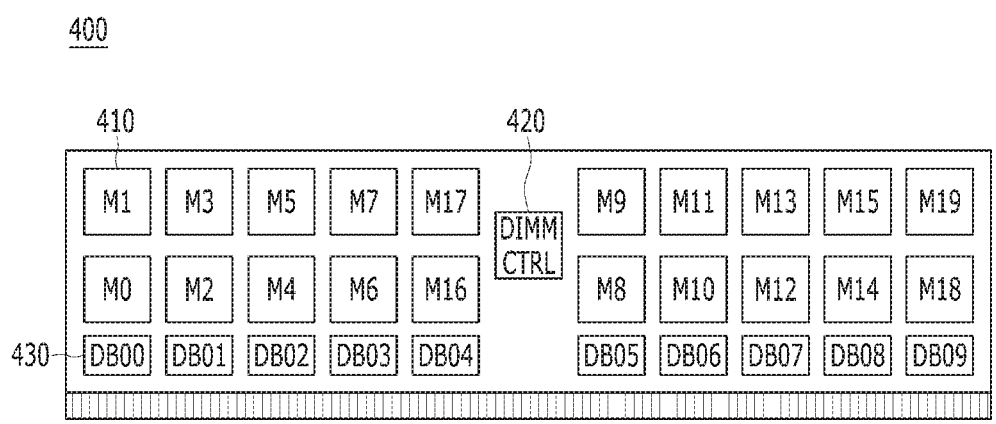
FIG. 15 is a diagram illustrating a memory module in accordance with an embodiment of the present invention.

FIG. 15 is a diagram illustrating a memory module 400 in accordance with an embodiment of the present invention.

Referring to FIG. 15, the memory module 400 may include a plurality of memory devices 410, a module controller (DIMM CTRL) 420, and a plurality of data buffers 430. Although FIG. 15 shows the memory module 400 including 18 memory devices M1 to M18 and 10 data buffers DB00 to DB09, the present invention is not limited to this configuration; the number of the memory devices 410 may be based on the structure and input/output configuration of the memory module 400. The memory devices 410, the module controller 420, and the data buffers 430 may be integrated into one substrate, e.g., a printed circuit board (PCB).

In an embodiment of the present invention, each of the memory devices 410 may correspond to the memory device 110 of FIG. 1, and the module controller 420 may correspond to the memory controller 120 of FIG. 1. Accordingly, the module controller 420 may include a BIST circuit and a BIRA circuit. The BIRA circuit may respectively store first and second spare counts R_CNT and C_CNT by counting the number of repairable row spares and column spares, and generate repair information INF_R to select a target repair address based on a fail address FADD for each bank, according to the first and second spare counts R_CNT and C_CNT. Each of the memory devices 410 may perform a repair operation to replace defective rows or columns with rows and column spares, according to the repair information INF_R.

As is apparent from the above description, the resistive memory device in accordance with embodiments of the present invention may reduce write latency and reduce power consumption by omitting an unnecessary pre-read operation during a selective write operation.

While the present invention has been illustrated and described with respect to specific embodiments, such embodiments are not intended to be restrictive, but rather descriptive. Further, it is noted that the present invention may be achieved in various other ways through substitution, change, and modification of various features of the described embodiments, as those skilled in the art will understand, without departing from the spirit and/or scope of the present invention as defined by the following claims.

What is claimed is:

1. A memory system comprising: a memory device including a plurality of banks, each including row and column spares for replacing defective rows and columns; and a memory controller configured to control an operation of the memory device, wherein the memory controller includes: a built-in self-test (BIST) circuit configured to perform a test operation on the banks and generate fail addresses for each bank based on a result of the test operation; and a built-in redundancy analysis (BIRA) circuit configured to determine first and second spare counts by respectively counting a number of repairable row spares and repairable column spares, wherein the BIRA circuit includes a target selecting circuit configured to select a target repair address from the fail addresses for each bank, according to the first and second spare counts, wherein the target selecting circuit includes: a pivot analyzer configured to output a spare valid bit by determining whether the fail address corresponds to a spare pivot or a non-spare pivot, and output a non-spare state bit by determining whether the non-spare pivot is in a cross state or in a non-cross state; a first pivot processor configured to process the spare pivot, according to the first and second spare counts, the spare valid bit, and the fail address; a second pivot processor configured to process the non-spare pivot in the cross state, according to a result of the first pivot processor, the first and second spare counts, the non-spare state bit, and the fail address; and a solution circuit configured to select the target repair address according to a result of the second pivot processor, and provide repair information to each bank.

2. The memory system of claim 1,
wherein the BIRA circuit determines whether each of the fail addresses correspond to the spare pivot or the non-spare pivot, where each spare pivot has a row address and a column address which do not overlap with any of a row address and a column address of previously detected fail cell, and
wherein the BIRA circuit does not select the target repair address when the number of the fail addresses classified as spare pivots is greater than a sum of the first and second spare counts.

3. The memory system of claim 1, wherein the BIRA circuit further includes:
a fail address storing circuit configured to store the fail addresses provided from the BIST circuit;
a redundancy information acquiring circuit configured to generate the first and second spare counts by respectively counting the number of repairable row spares and repairable column spares; and
a counting information storing circuit configured to store the first and second spare counts for each bank.

4. The memory system of claim 3,
wherein the memory device includes: a redundancy information storing circuit including a plurality of memory sets for storing fail information for each bank, and
wherein the redundancy information acquiring circuit counts the number of repairable row spares and repairable column spares based on enable information denoting whether the memory sets store valid fail information.

5. The memory system of claim 3, wherein the counting information storing circuit includes a plurality of count lines, each corresponding to the banks, and stores the first and second spare counts for each bank to the respective count lines.

6. The memory system of claim 1, wherein the pivot analyzer determines whether the fail address corresponds to the spare pivot or the non-spare pivot, where the spare pivot has a row address and a column address, which do not overlap with any of a row address and a column address of the fail address stored in a fail address storing circuit; and determines that the non-spare pivot is in the cross state in a case in which the row address and the column address of the non-spare pivot overlap with the row address and the column address of the spare pivot, and that the non-spare pivot is in the non-cross state in a case in which the row address or column address of the non-spare pivot does not overlap with the row address or column address of the spare pivot.

7. The memory system of claim 1, wherein the first pivot processor includes a first table whose size is set by the first and second spare counts, and stores the fail address into the first table according to the spare valid bit.

8. The memory system of claim 7, wherein the first table has a plurality of row lines whose number corresponds to a sum of the first and second spare counts.

9. The memory system of claim 1, wherein the second pivot processor includes a second table whose size is set by the first and second spare counts, and stores the fail address into the second table according to the result of the first pivot processor and the non-spare state bit.

10. The memory system of claim 9, wherein the second table has a plurality of row lines and column lines, each of which has the number corresponding to a sum of the first and second spare counts.

11. The memory system of claim 1, wherein the memory device and the memory controller are integrated into one substrate to configure a module structure.

12. A redundancy analysis circuit comprising:
a fail address storing circuit configured to store fail addresses each including a bank address, a row address, and a column address;
a redundancy information acquiring circuit configured to generate first and second spare counts by respectively counting the number of repairable row spares and repairable column spares;
a counting information storing circuit configured to store the first and second spare counts for each bank; and
a target selecting circuit configured to select a target repair address from the fail addresses for each bank, according to the first and second spare counts,
wherein the target selecting circuit includes:
a pivot analyzer configured to output a spare valid bit by determining whether the fail address corresponds to a spare pivot or a non-spare pivot, and output a non-spare state bit by determining whether the non-spare pivot is in a cross state or in a non-cross state;
a first pivot processor configured to process the spare pivot, according to the first and second spare counts, the spare valid bit, and the fail address;
a second pivot processor configured to process the non-spare pivot in the cross state, according to a result of the first pivot processor, the first and second spare counts, the non-spare state bit, and the fail address; and
a solution circuit configured to select the target repair address according to a result of the second pivot processor, and provide repair information to each bank.

13. The redundancy analysis circuit of claim 12,
wherein the target selecting circuit determines whether each of the fail addresses correspond to the spare pivot or the non-spare pivot, where the spare pivot has the row address and the column address, which do not overlap with any of the row address and the column address of the fail address stored in the fail address storing circuit, and
wherein the target selecting circuit does not select the target repair address when the number of the fail addresses classified as spare pivots is greater than a sum of the first and second spare counts.

14. The redundancy analysis circuit of claim 12, wherein the pivot analyzer
determines whether the fail address corresponds to the spare pivot or the non-spare pivot, where the spare pivot has the row address and the column address, which do not overlap with any of the row address and the column address of the fail address stored in the fail address storing circuit; and
determines that the non-spare pivot is in the cross state in a case in which the row address and the column address of the non-spare pivot overlap with the row address and the column address of the spare pivot, and that the non-spare pivot is in the non-cross state in a case in which the row address or column address of the non-spare pivot does not overlap with the row address or column address of the spare pivot.

15. The redundancy analysis circuit of claim 12, wherein the first pivot processor includes a first table whose size is set by the first and second spare counts, and stores the fail address into the first table according to the spare valid bit.

16. The redundancy analysis circuit of claim 12, wherein the second pivot processor includes a second table whose size is set by the first and second spare counts, and stores the fail address into the second table according to the result of the first pivot processor and the non-spare state bit.

17. A method of operating a memory system including a memory device including a plurality of banks, and a memory controller including a built-in self-test (BIST) circuit and a built-in redundancy analysis (BIRA) circuit, the method comprising:
determining, by the BIRA circuit, first and second spare counts by respectively counting the number of repairable row spares and repairable column spares for each bank;
performing, by the BIST circuit, a test operation on the banks and generating fail addresses for each bank based on a result of the test operation; and
selecting, by the BIRA circuit, a target repair address from the fail addresses for each bank, according to the first and second spare counts,
wherein the selecting a target repair address includes:
determining a size of a first table for storing a spare pivot and a size of a second table for storing a non-spare pivot in a cross state, according to the first and second spare counts;
analyzing the fail addresses for each bank;
storing the fail address in the first table and defining fields of the second table, when the fail address corresponds to the spare pivot;
updating the fields of the second table with the fail address, when the fail address corresponds to the non-spare pivot in the cross state; and
selecting the target repair address based on the second table.

18. The method of claim 17, further comprising:
determining, by the BIRA circuit, whether each of the fail addresses correspond to the spare pivot or the non-spare pivot, wherein the spare pivot has a row address and a column address, which do not overlap with any of a row address and a column address of previously detected fail cell, and
skipping, by the BIRA circuit, the selecting of the target repair address when the number of the fail addresses classified as spare pivots is greater than a sum of the first and second spare counts.

19. The method of claim 18, wherein the analyzing the fail addresses for each bank includes:
determining whether each fail address corresponds to the spare pivot or the non-spare pivot, where the spare pivot has the row address and the column address, which do not overlap with any of the row address and the column address of the fail address; and
determines that the non-spare pivot is in the cross state in a case in which the row address and the column address of the non-spare pivot overlap with the row address and the column address of the spare pivot, and that the non-spare pivot is in a non-cross state in a case in which the row address or column address of the non-spare pivot does not overlap with the row address or column address of the spare pivot.

20. The method of claim 17, wherein the first table has a plurality of row lines whose number corresponds to a sum of the first and second spare counts.

21. The method of claim 17, wherein the second table has a plurality of row lines and column lines, each of which has the number corresponding to a sum of the first and second spare counts.

22. The method of claim 17, wherein the storing the fail address in the first table includes:
skipping the selecting of the target repair address when the first table is full.

* * * * *